United States Patent
Hayashi et al.

(10) Patent No.: US 9,202,928 B2
(45) Date of Patent: Dec. 1, 2015

(54) THIN FILM SEMICONDUCTOR DEVICE AND MANUFACTURING METHOD THEREFOR

(71) Applicant: JOLED INC., Tokyo (JP)

(72) Inventors: Hiroshi Hayashi, Hyogo (JP); Tomoaki Izumi, Hyogo (JP); Mami Nonoguchi, Hyogo (JP); Toshiaki Yoshitani, Hyogo (JP)

(73) Assignee: JOLED INC., Tokyo (JP)

( * ) Notice: Subject to any disclaimer, the term of this patent is extended or adjusted under 35 U.S.C. 154(b) by 0 days.

(21) Appl. No.: 14/480,958

(22) Filed: Sep. 9, 2014

(65) Prior Publication Data

US 2015/0091002 A1  Apr. 2, 2015

(30) Foreign Application Priority Data

Sep. 30, 2013 (JP) ................. 2013-205683

(51) Int. Cl.
*H01L 21/26* (2006.01)
*H01L 29/786* (2006.01)
*H01L 21/02* (2006.01)

(52) U.S. Cl.
CPC .... *H01L 29/78693* (2013.01); *H01L 21/02554* (2013.01); *H01L 21/02565* (2013.01); *H01L 21/02664* (2013.01); *H01L 21/02631* (2013.01)

(58) Field of Classification Search
CPC .............. H01L 21/02554; H01L 21/02565; H01L 21/02664; H01L 21/02631; H01L 29/78693
See application file for complete search history.

(56) References Cited

U.S. PATENT DOCUMENTS

2012/0267624 A1* 10/2012 Isobe .................. H01L 27/0688
257/43
2013/0221351 A1 8/2013 Ebata et al.

FOREIGN PATENT DOCUMENTS

JP 2007311404 A 11/2007
WO WO2012090490 A1 7/2012

* cited by examiner

*Primary Examiner* — Roy Potter
*Assistant Examiner* — Paul Patton
(74) *Attorney, Agent, or Firm* — Greenblum & Bernstein, P.L.C.

(57) ABSTRACT

A thin film semiconductor device comprises a substrate, a gate electrode disposed above the substrate, an oxide semiconductor layer disposed above the substrate so as to oppose the gate electrode, a channel protective layer disposed on the oxide semiconductor layer, and a source electrode and a drain electrode each connected to the oxide semiconductor layer. The density of states DOS [$eV^{-1}cm^{-3}$] of oxygen defects in the oxide semiconductor layer satisfies the following relationship:

$$DOS \leq 1.710 \times 10^{17} \times (Ec-E)^2 - 6.468 \times 10^{17} \times (Ec-E) + 6.113 \times 10^{17}$$

provided that $2.0 \text{ eV} \leq Ec-E \leq 2.7 \text{ eV}$
where $Ec$ [eV] is an energy level of a conduction band edge of the oxide semiconductor layer and $E$ [eV] is a predetermined energy level of the oxide semiconductor layer.

16 Claims, 13 Drawing Sheets

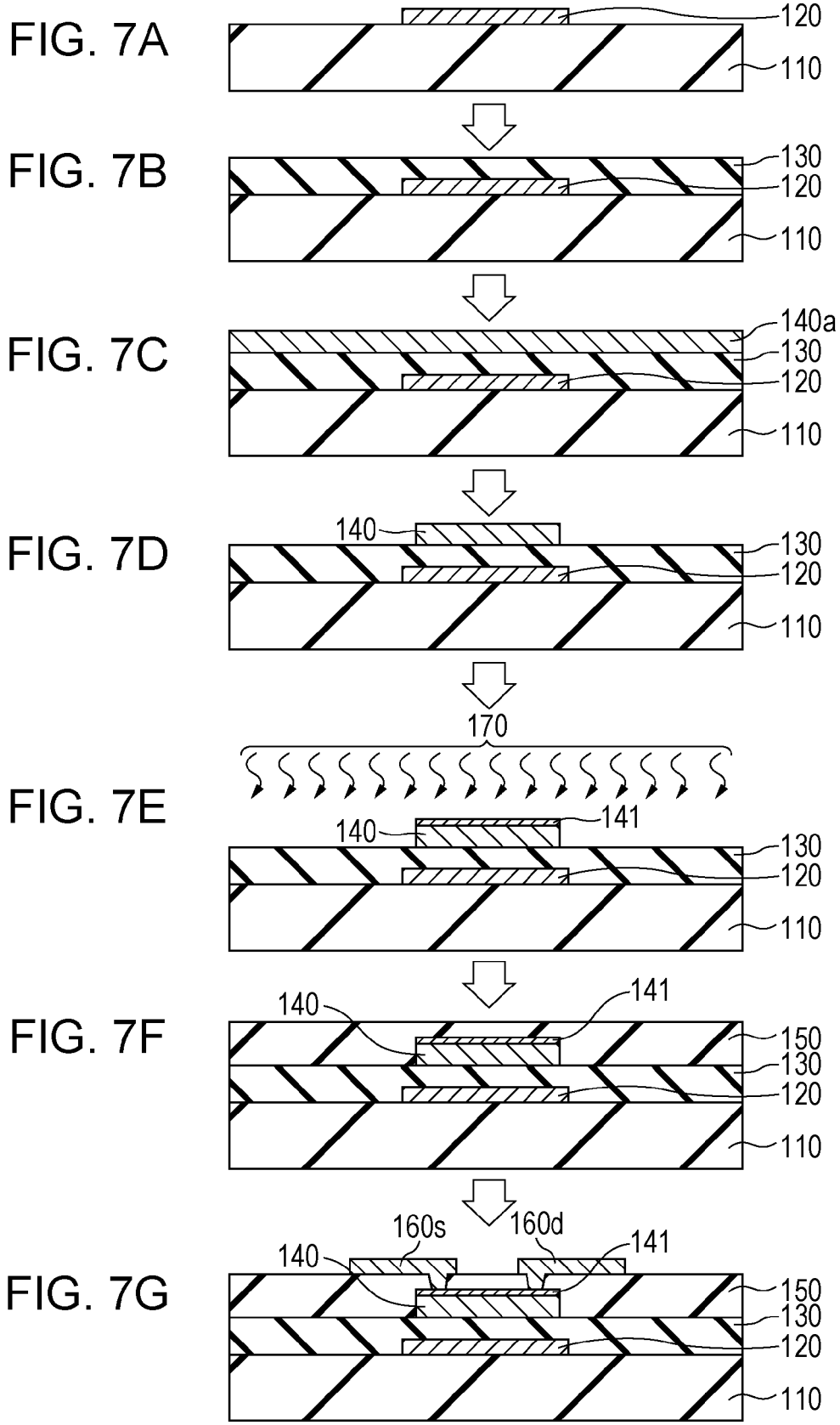

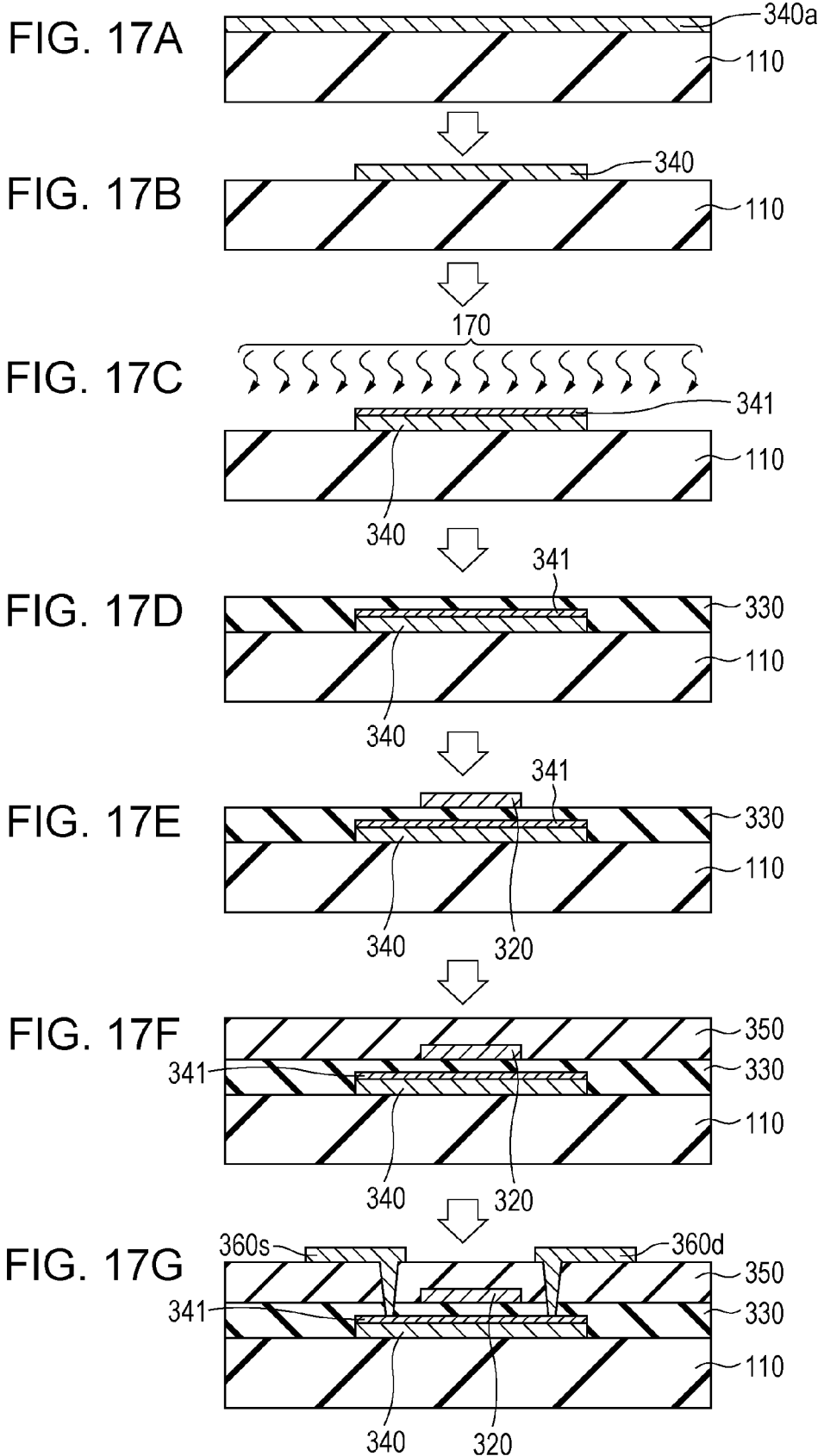

THIN FILM SEMICONDUCTOR DEVICE AND MANUFACTURING METHOD THEREFOR

BACKGROUND

1. Field

This disclosure relates to a thin film semiconductor device and a method for manufacturing the thin film semiconductor device.

2. Description of the Related Art

Thin film transistors (TFTs) are widely used as switching devices or driving elements of active-matrix display devices such as liquid crystal display devices and organic electroluminescence (EL) display devices.

In recent years, TFTs that include channel layers composed of oxide semiconductors such as zinc oxide (ZnO), indium gallium oxide (InGaO), and indium gallium zinc oxide (InGaZnO) have been actively researched and developed. TFTs that contain oxide semiconductors in channel layers feature low OFF current and high carrier mobility even in an amorphous state and can be manufactured through low-temperature processes.

Japanese Unexamined Patent Application Publication No. 2007-311404 discloses a technique for producing TFTs having stable characteristics. According to this technique, a heat treatment is performed after formation of an oxide semiconductor film. International Publication No. 2012/090490 discloses a technique of performing a plasma treatment such as an ozone treatment on an oxide semiconductor film after formation of the oxide semiconductor film and before formation a protective film. It also discloses that this plasma treatment suppresses occurrence of oxygen defects in the oxide semiconductor film.

In forming thin film semiconductor devices by the techniques described above, a plasma treatment is performed on an oxide semiconductor film to suppress occurrence of oxygen defects; however, the conditions of the plasma treatment are not disclosed. Thus, the oxide semiconductor may be damaged by the plasma treatment and the characteristics may become degraded depending on the conditions.

SUMMARY

This disclosure provides a thin film semiconductor device that has stable characteristics and a method for manufacturing the thin film semiconductor device.

Additional benefits and advantages of the disclosed embodiments will be apparent from the specification and figures. The benefits and/or advantages may be individually provided by the various embodiments and features of the specification and drawings disclosure, and need not all be provided in order to obtain one or more of the same.

An aspect of the disclosure provides a thin film semiconductor device that comprises a substrate, a gate electrode disposed above the substrate, an oxide semiconductor layer disposed above the substrate so as to oppose the gate electrode, a first insulating layer disposed on the oxide semiconductor layer, and a source electrode and a drain electrode each connected to the oxide semiconductor layer. A density of states DOS $[eV^{-1}cm^{-3}]$ of oxygen defects in the oxide semiconductor layer satisfies the following relationship:

$$DOS \leq 1.710 \times 10^{17} \times (Ec-E)^2 - 6.468 \times 10^{17} \times (Ec-E) + 6.113 \times 10^{17}$$

provided that $2.0 \text{ eV} \leq Ec-E \leq 2.7 \text{ eV}$ where Ec [eV] is an energy level of a conduction band edge of the oxide semiconductor layer and E [eV] is a predetermined energy level of the oxide semiconductor layer.

These general and specific aspects may be implemented using a process, an electronic device, a system, and an integrated circuit, and any combination of a process, an electronic device, a system, and an integrated circuit.

According to this disclosure, a thin film semiconductor device that has more stable characteristics, and a method for manufacturing the thin film semiconductor device can be provided.

BRIEF DESCRIPTION OF THE DRAWINGS

FIGS. 7A to 7G are schematic cross-sectional views illustrating a method for manufacturing a thin film semiconductor device according to the first embodiment.

FIGS. 17A to 17G are schematic cross-sectional views illustrating a method for manufacturing a thin film semiconductor device according to the third embodiment.

DESCRIPTION OF EMBODIMENTS

Findings that Form a Basis of this Disclosure

A typical thin film semiconductor device has been found to have the following drawbacks.

Figure 1A:
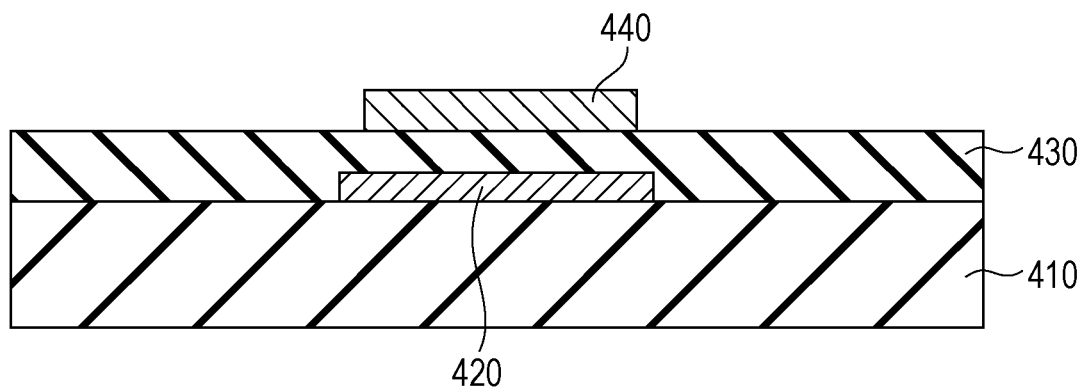
FIGS. 1A and 1B are schematic cross-sectional views illustrating a method for manufacturing a typical thin film semiconductor device.
Figure 1B:
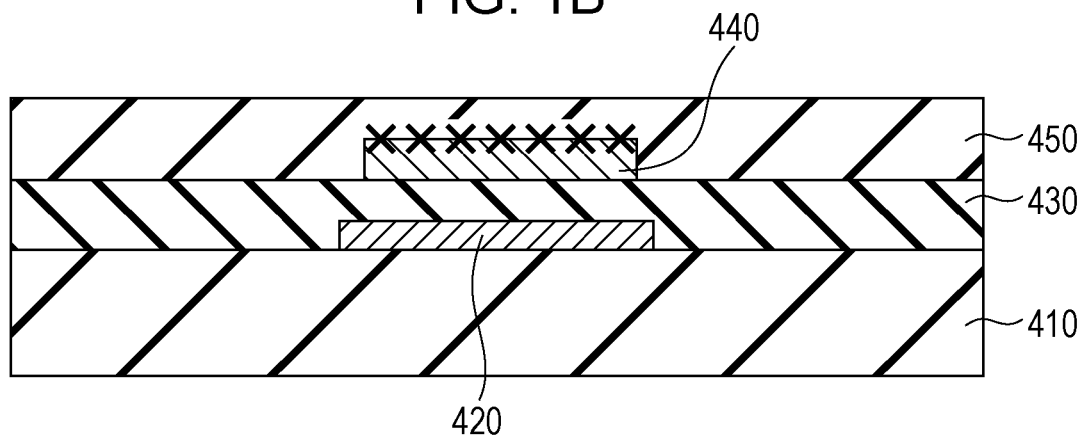

FIGS. 1A and 1B are schematic cross-sectional views illustrating a method for manufacturing a typical thin film semiconductor device.

Referring to FIG. 1A, a gate electrode 420 is formed on a substrate 410 and a gate insulating film 430 is formed on the gate electrode 420. A patterned oxide semiconductor layer 440 is formed on the gate insulating film 430. In particular, an InGaZnO layer is formed on the gate insulating film 430 by a sputtering method or the like and then patterned by a wet etching method. The oxide semiconductor layer 440 is formed in this way.

Referring to FIG. 1B, a channel protection layer 450 is formed on the gate insulating film 430 so as to cover the oxide semiconductor layer 440. In particular, a silicon oxide film is formed by a plasma chemical vapor deposition (CVD) method on the gate insulating film 430 so as to cover the oxide semiconductor layer 440. The channel protection layer 450 is formed in this way.

During this process, as shown in FIG. 1B, oxygen defects occur in the oxide semiconductor layer 440 due to process damage. In particular, oxygen defects occur in the oxide semiconductor layer 440 due to wet etching at the time of the formation of the oxide semiconductor layer 440 or due to a plasma treatment at the time of the formation of the channel protection layer 450.

Figure 2:
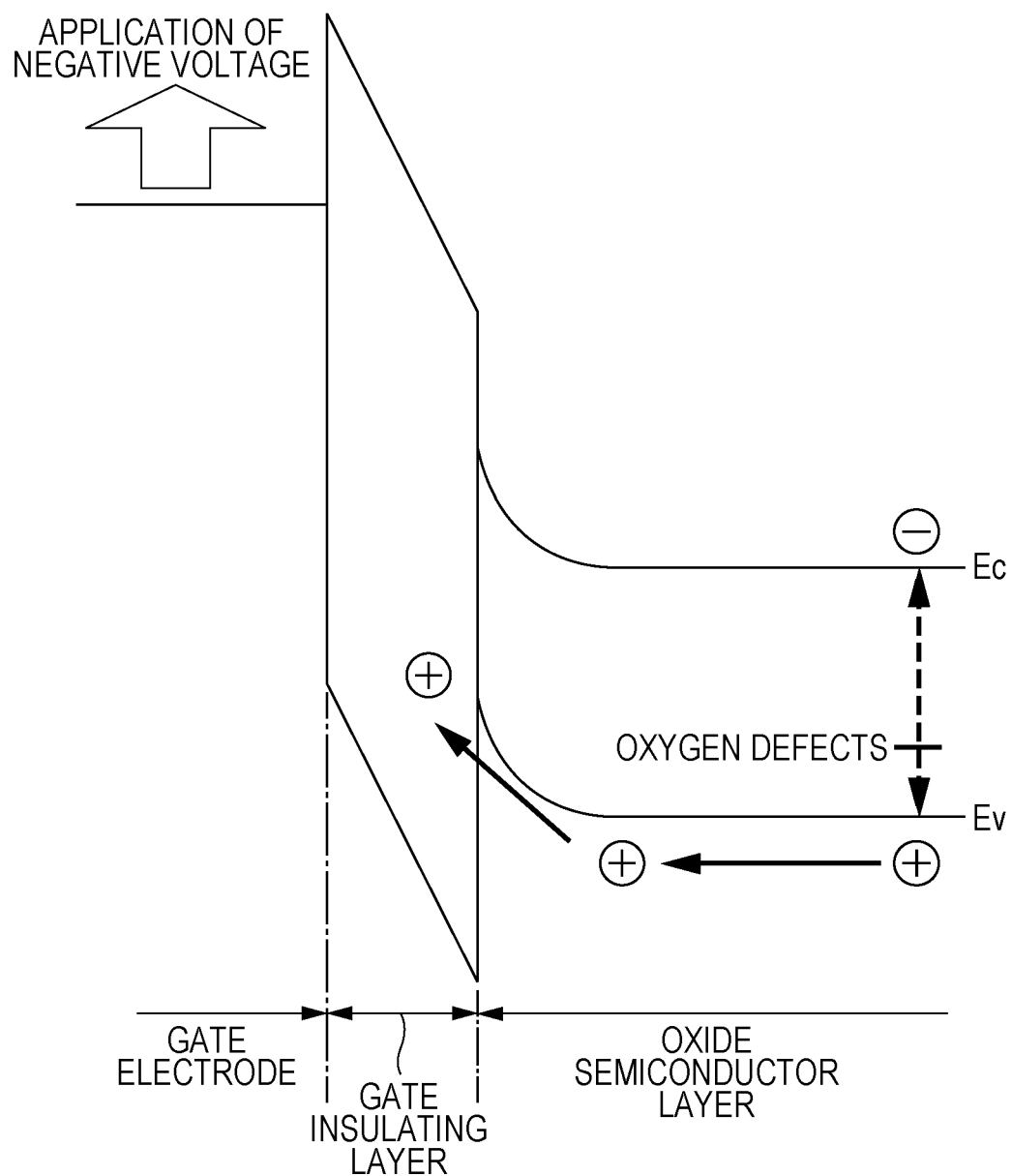
FIG. 2 is an energy band diagram describing a problem caused by oxygen defects.

FIG. 2 is an energy band diagram describing a problem caused by oxygen defects.

As shown in FIG. 2, oxygen defects in an oxide semiconductor layer become a source of carriers. In particular, electrons and holes are generated once heat or light energy is applied to the oxide semiconductor layer.

When a negative voltage is applied to a gate electrode, holes generated in the oxide semiconductor layer are attracted to the negative voltage in the gate electrode and become captured in the gate insulating layer. As a result, a negative shift in threshold voltage occurs. Accordingly, for example, when this thin film semiconductor device is used as a drive transistor of a display, this negative shift in threshold voltage causes luminance variation.

Oxygen defects in the oxide semiconductor layer decrease the resistance in a back channel-side region (hereinafter referred to as a back channel region) of the oxide semiconductor layer. Carriers move about in the back channel region with a decreased resistance and the current in the oxide semiconductor layer increases as a result. The back channel region discussed here is a region in the oxide semiconductor layer on the opposite side of the gate electrode (in FIG. 1B, the upper region of the oxide semiconductor layer 440).

Figure 3:
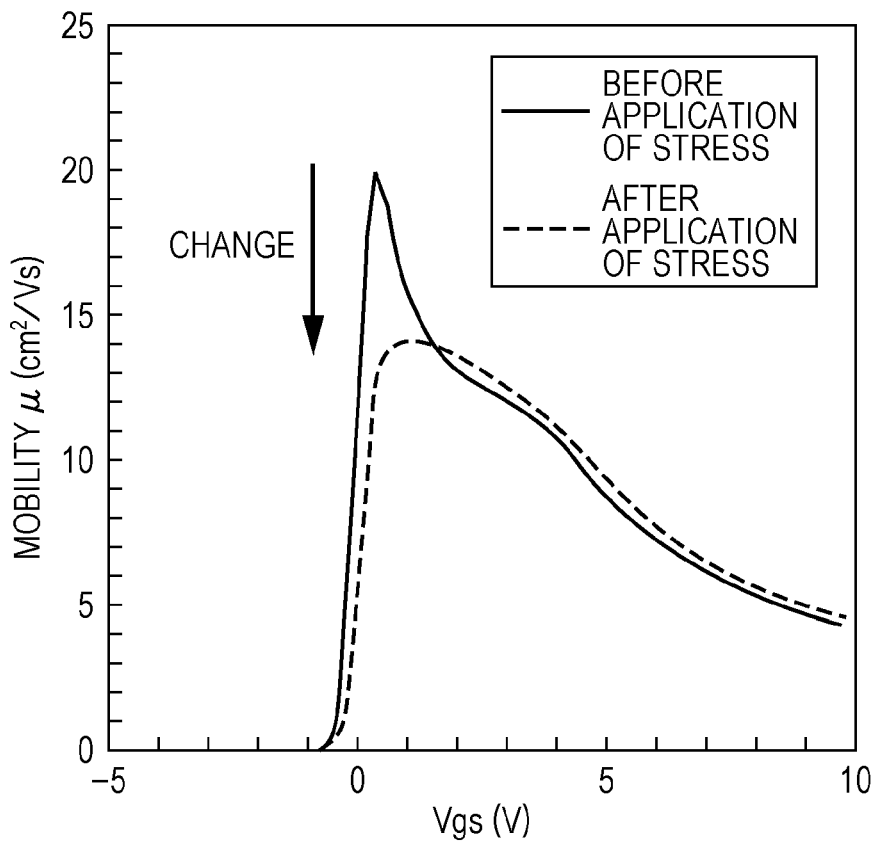
FIG. 3 is a graph showing a mobility-voltage characteristic of a typical thin film semiconductor device before and after application of stress

FIG. 3 is a graph showing a mobility-voltage characteristic of a typical thin film semiconductor device before and after application of stress.

Because the resistance in the back channel region is decreased, as shown in FIG. 3, the plot of the mobility against the gate-source voltage has a peak (hereinafter referred to as a mobility curve peak) if the gate-source voltage (Vgs) is lower than the drain-source voltage (Vds). The mobility curve peak changes greatly between before and after application of stress, as shown in FIG. 3. Accordingly, for example, when this thin film semiconductor device is used as a drive transistor of a display, the change in the mobility curve peak causes luminance variation.

As described above, a typical thin film semiconductor device cannot exhibit stable characteristics because of occurrence of oxygen defects.

BRIEF OVERVIEW OF THE DISCLOSURE

A thin film semiconductor device according to this disclosure comprises a substrate, a gate electrode disposed above the substrate, an oxide semiconductor layer disposed above the substrate so as to oppose the gate electrode, a first insulating layer disposed on the oxide semiconductor layer, and a source electrode and a drain electrode each connected to the oxide semiconductor layer, in which a density of states DOS $[eV^{-1}cm^{-3}]$ of oxygen defects in the oxide semiconductor layer satisfies the following relationship:

$$DOS \leq 1.710 \times 10^{17} \times (Ec-E)^2 - 6.468 \times 10^{17} \times (Ec-E) + 6.113 \times 10^{17}$$

provided that 2.0 eV ≤ Ec−E ≤ 2.7 eV
where Ec [eV] is an energy level of a conduction band edge of the oxide semiconductor layer and E [eV] is a predetermined energy level of the oxide semiconductor layer.

Since the thin film semiconductor device includes an oxide semiconductor layer having a low density of states of oxygen defects, the negative shift in threshold voltage is decreased and the mobility curve peak is decreased. Accordingly, the thin film semiconductor device exhibits more stable characteristics.

In the thin film semiconductor device according to this disclosure, the density of states DOS $[eV^{-1}cm^{-3}]$ may satisfy the following relationship:

$$DOS \leq 1.332 \times 10^{10} \times (Ec-E)^{14.65}$$

provided that 2.0 eV ≤ Ec−E ≤ 2.7 eV.

Since the thin film semiconductor device includes an oxide semiconductor layer having an even lower low density of states of oxygen defects, the negative shift in threshold voltage is further decreased and the mobility curve peak is further decreased. Accordingly, the thin film semiconductor device exhibits more stable characteristics.

The thin film semiconductor device according to this disclosure may further comprise a second insulating layer disposed on the gate electrode. The oxide semiconductor layer may be disposed on the second insulating layer. A contact hole for exposing part of the oxide semiconductor layer may be disposed in the first insulating layer. The source electrode and the drain electrode may be disposed on the first insulating layer and connected to the oxide semiconductor layer through the contact hole.

According to this structure, the thin film semiconductor device can be used as a bottom-gate, channel-protective thin film transistor and exhibits more stable characteristics.

The thin film semiconductor device according to this disclosure may further comprise a second insulating layer formed on the gate electrode. The oxide semiconductor layer may be disposed on the second insulating layer. The source electrode and the drain electrode may be disposed on the oxide semiconductor layer. The first insulating layer may be disposed on the source electrode, the drain electrode, and the oxide semiconductor layer.

According to this structure, the thin film semiconductor device can be used as a bottom-gate, channel-etch thin film transistor and exhibits more stable characteristics.

In the thin film semiconductor device according to this disclosure, the gate electrode may be disposed on the first insulating layer.

According to this structure, the thin film semiconductor device can be used as a top-gate thin film transistor and exhibits more stable characteristics.

In the thin film semiconductor device according to this disclosure, the oxide semiconductor layer may comprise a transparent amorphous oxide semiconductor.

Since the oxide semiconductor layer includes a transparent amorphous oxide semiconductor, the carrier mobility can be increased.

A method for manufacturing a thin film semiconductor device according to this disclosure comprises steps of: (a) forming a gate electrode above a substrate, (b) forming an oxide semiconductor layer at a position above the substrate and opposing the gate electrode, (c) performing a plasma treatment on the oxide semiconductor layer by using gas containing oxygen, (d) forming a first insulating layer on the oxide semiconductor layer, and (e) forming a source electrode and a drain electrode each connected to the oxide semiconductor layer. In the performing step (c) the plasma treatment is performed in particular conditions that a density of states DOS $[eV^{-1}cm^{-3}]$ of oxygen defects in the oxide semiconductor layer satisfies the following relationship:

$$DOS \leq 1.710 \times 10^{17} \times (Ec-E)^2 - 6.468 \times 10^{17} \times (Ec-E) + 6.113 \times 10^{17}$$

provided that $2.0\ eV \leq Ec-E \leq 2.7\ eV$ where Ec [eV] is an energy level of a conduction band edge of the oxide semiconductor layer and E [eV] is a predetermined energy level of the oxide semiconductor layer.

According to this method, since the density of states of oxygen defects in the oxide semiconductor layer is low, the negative shift in threshold voltage can be decreased and the mobility curve peak can be decreased. Accordingly, a thin film semiconductor device having more stable characteristics can be manufactured.

In the method for manufacturing a thin film semiconductor device according to this disclosure, the gas may contain nitrous, oxide and a power density of the plasma treatment may be 1 $[W/cm^2]$ or less.

According to this method, an oxide semiconductor layer having a sufficiently low density of states of oxygen defects can be formed by performing a plasma treatment at a power density of 1 $[W/cm^2]$ or less and thus the negative shift in threshold voltage can be decreased.

In the method for manufacturing a thin film semiconductor device according to this disclosure, the power density of the plasma treatment may be 0.2 $[W/cm^2]$ or more.

According to this method, an oxide semiconductor layer having a sufficiently low density of states of oxygen defects can be formed by performing a plasma treatment at a power density of 0.2 $[W/cm^2]$ or more and thus the negative shift in threshold voltage can be decreased.

In the method for manufacturing a thin film semiconductor device according to this disclosure, the gas may contain nitrous oxide, and in the performing step (c) the plasma treatment may be performed at a pressure of 2.0 [Torr] or more.

According to this method, an oxide semiconductor layer having a sufficiently low density of states of oxygen defects can be formed by performing a plasma treatment at a pressure of 2.0 [Torr] or more and thus the mobility curve peak can be decreased.

The method for manufacturing a thin film semiconductor device according to this disclosure may further comprise a step of: (f) forming a second insulating layer on the gate electrode. In the forming step (b) the oxide semiconductor layer may be formed on the second insulating layer. In the forming step (d) the first insulating layer may be formed so that part of the oxide semiconductor layer is exposed. In the forming step (e) the source electrode and the drain electrode may be formed so as to connect to the oxide semiconductor layer at the exposed part.

According to this method, a thin film semiconductor device which can be used as a bottom-gate, channel-protective thin film transistor having more stable characteristics can be manufactured.

The method for manufacturing a thin film semiconductor device according to this disclosure may further comprise a step of: (f) forming a second insulating layer on the gate electrode. In the forming step (b) the oxide semiconductor layer may be formed on the second insulating layer. In the forming step (e) the source electrode and the drain electrode may be formed on the oxide semiconductor layer. In the forming step (d) the first insulating layer may be formed on the source electrode, the drain electrode, and the oxide semiconductor layer.

According to this method, a thin film semiconductor device which can be used as a bottom-gate, channel-etch thin film transistor having more stable characteristics can be manufactured.

In the method for manufacturing a thin film semiconductor device according to this disclosure, the performing step (c) may be performed before the forming step (e).

According to this method in which a plasma treatment is performed before forming a source electrode and a drain electrode, a source electrode, a drain electrode, and a first insulating layer can be formed after the density of states of oxygen defects in the oxide semiconductor layer is decreased. Accordingly, a thin film semiconductor device having more stable characteristics can be manufactured.

In the forming a gate electrode of the method for manufacturing a thin film semiconductor device according to this disclosure, in the forming step (a) the gate electrode may be formed on the first insulating layer.

According to this method, a thin film semiconductor device that can be used as a top-gate thin film transistor having more stable characteristics can be manufactured.

In the method for manufacturing a thin film semiconductor device according to this disclosure, the performing step (c) may be performed before the forming step (d).

According to this method in which a plasma treatment is performed before forming a first insulating layer, a first insulating layer can be formed after the density of states of oxygen defects in the oxide semiconductor layer is decreased. Moreover, occurrence of oxygen defects during formation of the first insulating layer can be suppressed.

In the method for manufacturing a thin film semiconductor device according to this disclosure, the oxide semiconductor layer may comprise a transparent amorphous oxide semiconductor.

Since the oxide semiconductor layer is a transparent amorphous oxide semiconductor layer, a thin film semiconductor device having a high carrier mobility can be manufactured.

Embodiments of a thin film semiconductor device, a method for manufacturing the thin film semiconductor device, and an organic EL display device that includes the thin film semiconductor device will now be described with reference to the drawings. Note that the embodiments described below are merely some specific examples of this disclosure. The numerals, forms, materials, constitutional elements, positions and connecting forms of constitutional elements, steps, the order in which the steps are performed, etc., are merely illustrative and do not limit the scope of the present invention. Accordingly, among the constitutional elements described in the embodiments below, those which are not described in the independent claims that define the highest concept of the present invention are described as optional elements.

It should also be noted that the drawings are merely schematic views and do not necessarily present accurate illustrations. In the drawings, structures that are substantially identical are given the same reference characters and description therefor is simplified or omitted to avoid redundancy.

First Embodiment

Organic EL Display Device

Figure 4:
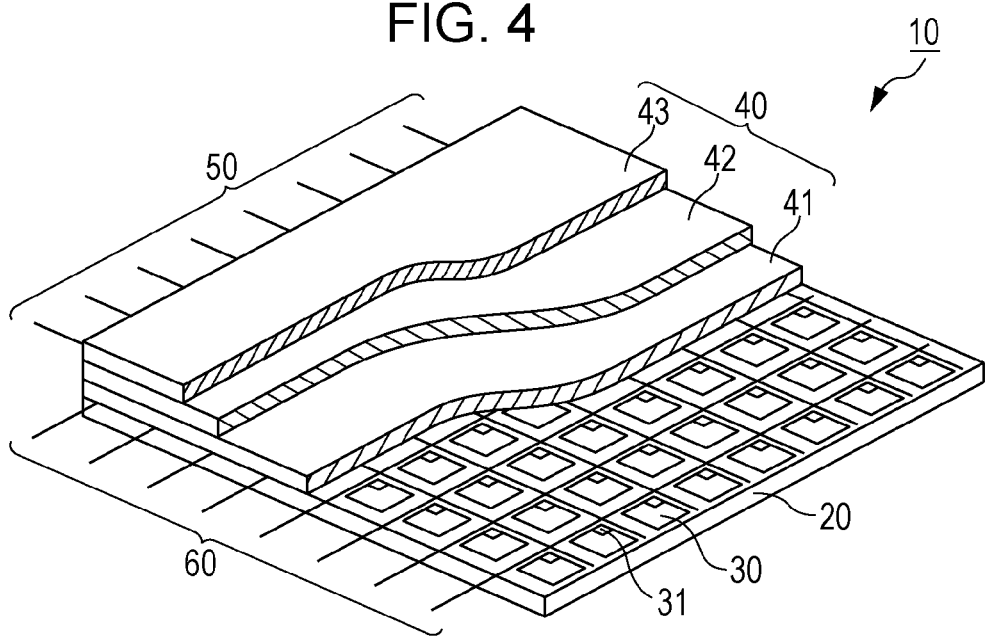
FIG. 4 is a perspective partially cutaway view of an organic EL display device according to a first embodiment.

First, a structure of an organic EL display device 10 according to a first embodiment is described with reference to FIG. 4. FIG. 4 is a perspective partially cutaway view of an organic EL display device according to this embodiment.

As shown in FIG. 4, the organic EL display device 10 has a multilayered structure that includes a TFT substrate (TFT array substrate) 20 in which plural thin film transistors are arranged and organic EL elements (emitting portions) 40. The organic EL elements each have an anode 41 which is a lower electrode, an EL layer 42 which is an emitting layer composed of an organic material, and a cathode 43 which is a transparent upper electrode.

In the TFT substrate 20, plural pixels 30 are arranged in a matrix and one pixel circuit 31 is provided for each of the pixels 30.

The organic EL elements 40 are formed to respectively correspond to the pixels 30. The pixel circuit 31 of each of the pixels 30 controls emission of the corresponding organic EL element 40. The organic EL elements 40 are formed on an interlayer dielectric film (planarizing film) that covers the thin film transistors.

The organic EL element 40 has a structure in which the EL layer 42 is interposed between the anode 41 and the cathode 43. A hole transport layer is stacked between the anode 41 and the EL layer 42 and an electron transport layer is stacked between the EL layer 42 and the cathode 43. An additional organic functional layer may be disposed between the anode 41 and the cathode 43.

Each of the pixels 30 is driven and controlled by the corresponding pixel circuit 31. In the TFT substrate 20, plural gate wires (scanning wires) 50, plural source wires (signal wires) 60, and plural power supply wires (not shown in FIG. 4) are formed. The plural gate wires 50 extend in the row direction of the pixels 30. The plural source wires 60 intersect the gate wires 50 and are arranged in the column direction of the pixels 30. The plural power supply wires are arranged in parallel to the source wires 60. Gate wires 50 and source wires 60 that intersect each other define each of the pixels 30.

A gate wire 50 is connected to a row of gate electrodes of the thin film transistors that work as switching elements in the pixel circuits 31. A source wire 60 is connected to a column of source electrodes of the thin film transistors that work as switching elements in the pixel circuits 31. A power source wire is connected to a column of drain electrodes of the thin film transistors that work as drive elements in the pixel circuits 31.

Figure 5:
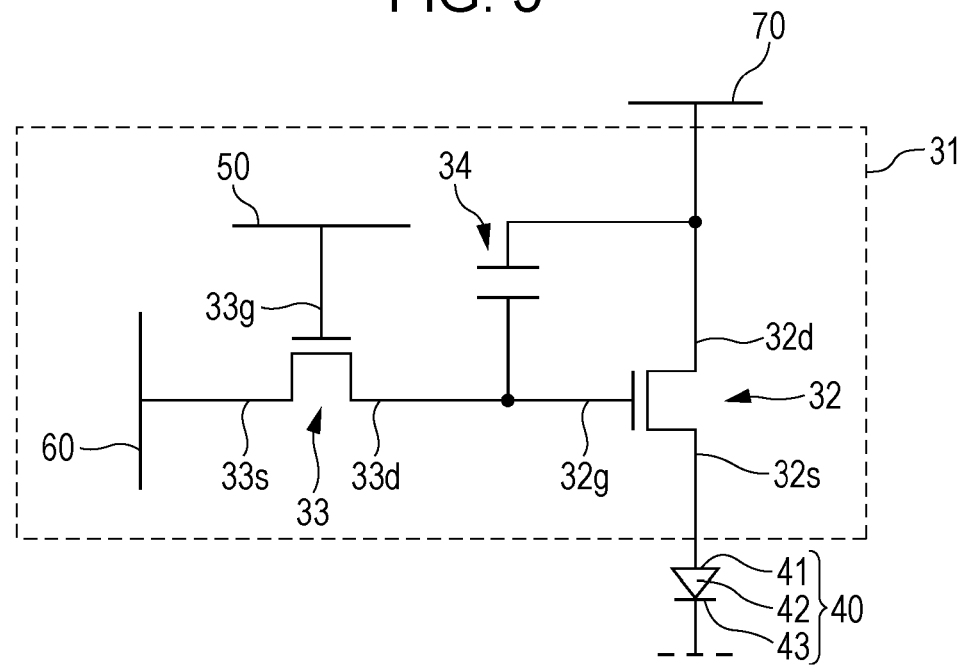
FIG. 5 is an electric circuit diagram showing the configuration of a pixel circuit in the organic EL display device according to the first embodiment.

The circuit configuration of the pixel circuit 31 of the pixel 30 will now be described with reference to FIG. 5. FIG. 5 is an electric circuit diagram showing the configuration of a pixel circuit of the organic EL display device of this embodiment.

As shown in FIG. 5, the pixel circuit 31 includes a thin film transistor 32 that functions as a drive element, a thin film transistor 33 that functions as a switching element, and a capacitor 34 that stores data for performing display in the corresponding pixel 30. In this embodiment, the thin film transistor 32 is a drive transistor for driving the organic EL element 40 and the thin film transistor 33 is a switching transistor for selecting a pixel 30.

The thin film transistor 32 includes a gate electrode 32g, a drain electrode 32d, a source electrode 32s, and a semiconductor film (not shown in the drawing). The gate electrode 32g is connected to the drain electrode 33d of the thin film transistor 33 and one end of the capacitor 34. The drain electrode 32d is connected to a power supply wire 70 and the other end of the capacitor 34. The source electrode 32s is connected to the anode 41 of the organic EL element 40.

The thin film transistor 32 supplies a current that corresponds to the data voltage held in the capacitor 34 to the anode 41 of the organic EL element 40 from the power supply wire 70 via the source electrode 32s. As a result, a drive current flows from the anode 41 to the cathode 43 in the organic EL element 40 and the EL layer 42 emits light.

The thin film transistor 33 includes a gate electrode 33g, a source electrode 33s, a drain electrode 33d, and a semiconductor film (not shown in the drawing). The gate electrode 33g is connected to the gate wire 50. The source electrode 33s is connected to the source wire 60. The drain electrode 33d is connected to one end of the capacitor 34 and the gate electrode 32g of the thin film transistor 32. When a particular voltage is applied to the gate wire 50 and the source wire 60 connected to this thin film transistor 33, the voltage applied to the source wire 60 is stored in the capacitor 34 as a data voltage.

Note that in the organic EL display device 10 having the aforementioned configuration, an active matrix system is employed. The active matrix system performs display control based on each of the pixels 30 located at the intersections of the gate wires 50 and the source wires 60. Under this system, the thin film transistors 32 and 33 of the pixels 30 (sub-pixels R, G, and B) are operated to cause the corresponding organic EL elements 40 to selectively emit light and display a desired image.

Thin Film Semiconductor Device

A thin film semiconductor device according to this embodiment will now be described. A thin film semiconductor device of this embodiment is a bottom-gate, channel-protective thin film transistor.

Figure 6:
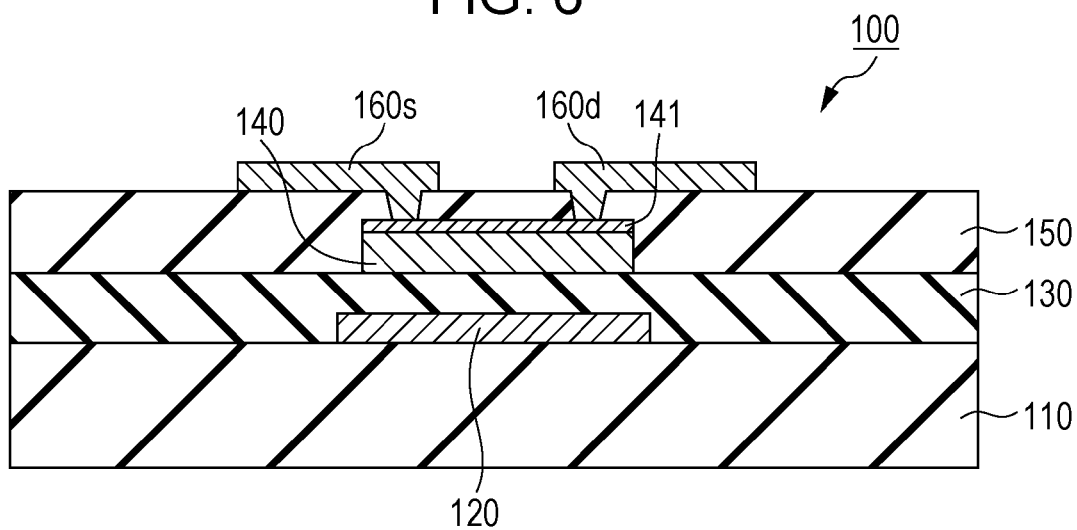
FIG. 6 is a schematic cross-sectional view of the thin film semiconductor device according to the first embodiment.

FIG. 6 is a schematic cross-sectional view of a thin film semiconductor device according to this embodiment.

Referring to FIG. 6, a thin film semiconductor device 100 according to this embodiment includes a substrate 110, a gate electrode 120, a gate insulating film 130, an oxide semiconductor layer 140, a channel protective layer 150, a source electrode 160s, and a drain electrode 160d. The oxide semiconductor layer 140 includes an oxygen rich layer 141.

The thin film semiconductor device 100 is, for example, a thin film transistor 32 or thin film transistor 33 shown in FIG. 5. In other words, the thin film semiconductor device 100 can be used as either a drive transistor or a switching transistor. In the case where the thin film semiconductor device 100 is a thin film transistor 32, the gate electrode 120 corresponds to the gate electrode 32g, the source electrode 160s corresponds to the source electrode 32s, and the drain electrode 160d corresponds to the drain electrode 32d. In the case where the thin film semiconductor device 100 is a thin film transistor 33, the gate electrode 120 corresponds to the gate electrode 33g, the source electrode 160s corresponds to the source electrode 33s, and the drain electrode 160d corresponds to the drain electrode 33d.

The substrate 110 is a substrate composed of a material having an electric insulation property. For example, the substrate 110 is a substrate composed of a glass material, such as alkali-free glass, quartz glass, or high-heat-resistance glass, a substrate composed of a resin material such as polyethylene, polypropylene, or polyimide, a substrate composed of a semiconductor material such as silicon or gallium arsenide, or a substrate composed of a metal material such as stainless steel coated with an insulating layer.

The substrate 110 may be a flexible substrate such as a resin substrate. In such a case, the thin film semiconductor device 100 can be used as a flexible display.

The gate electrode 120 is formed on the substrate 110 and has a predetermined form. The gate electrode 120 is an electrode composed of an electrically conductive material. Examples of the material for the gate electrode 120 include metals such as molybdenum, aluminum, copper, tungsten, titanium, manganese, chromium, tantalum, niobium, silver, gold, platinum, palladium, indium, nickel, and neodymium, alloys of these, conductive metal oxides such as indium tin oxide (ITO), aluminum-doped zinc oxide (AZO), and gallium-doped zinc oxide (GZO), and conductive polymers such as polythiophene and polyacetylene. The gate electrode 120 may have a multilayered structure formed by stacking these materials.

The gate insulating film 130 is an example of a second insulating layer formed on the gate electrode 120. The gate insulating film 130 is formed on the gate electrode 120 and the substrate 110 so as to cover the gate electrode 120.

The gate insulating film 130 is composed of a material having an electric insulation property. For example, the gate insulating film 130 is a single-layer film such as a silicon oxide film, a silicon nitride film, a silicon oxynitride film, an aluminum oxide film, a tantalum oxide film, or a hafnium oxide film, or a stacked film of these films.

The oxide semiconductor layer 140 is formed above the substrate 110 so as to oppose the gate electrode 120. In particular, the oxide semiconductor layer 140 is formed at a position that opposes the gate electrode 120 and on the gate insulating film 130. For example, an oxide semiconductor layer 140 having an island form is formed on the gate insulating film 130 and above the gate electrode 120.

An oxide semiconductor material that contains at least one selected from indium (In), gallium (Ga), and zinc (Zn) is used as the material for the oxide semiconductor layer 140. For example, the oxide semiconductor layer 140 is composed of a transparent amorphous oxide semiconductor (TAOS) such as amorphous indium gallium zinc oxide (InGaZnO:IGZO). The In:Ga:Zn ratio is, for example, about 1:1:1. The In:Ga:Zn ratio may be, but is not limited to be, in the range of 0.8 to 1.2:0.8 to 1.2:0.8 to 1.2.

A thin film transistor that includes a channel layer composed of a transparent amorphous oxide semiconductor has a high carrier mobility and is suitable for use in a large-screen, high-definition display devices. Since a transparent amorphous oxide semiconductor can be formed into a film at low temperature, it can be easily formed on a flexible substrate such as a plastic or a film.

As shown in FIG. 6, the oxygen rich layer 141 is formed in the back channel region of the oxide semiconductor layer 140. The oxygen rich layer 141 is a region having fewer oxygen defects among the oxide semiconductor layer 140 and is formed by a plasma treatment.

The details of the oxide semiconductor layer 140 are described later.

The channel protective layer 150 is one example of a first insulating layer formed on the oxide semiconductor layer 140. For example, the channel protective layer 150 is formed on the oxide semiconductor layer 140 and the gate insulating film 130 so as to cover the oxide semiconductor layer 140.

Holes are formed in part of the channel protective layer 150 so as to penetrate through the channel protective layer 150. In other words, contact holes for exposing part of the oxide semiconductor layer 140 (oxygen rich layer 141) are formed in the channel protective layer 150. The oxide semiconductor layer 140 is connected to the source electrode 160s and the drain electrode 160d through the opening portions (contact hole).

The channel protective layer 150 is composed of a material having an electric insulation property. For example, the channel protective layer 150 is a single-layer film, e.g., a film composed of an inorganic material, such as a silicon oxide film, a silicon nitride film, a silicon oxynitride film, or an aluminum oxide film or a film composed of an inorganic material containing silicon, oxygen, and carbon, or a multi-layered film that includes these films.

The source electrode 160s and the drain electrode 160d are formed on the channel protective layer 150 and each has a predetermined form. In particular, the source electrode 160s and the drain electrode 160d are connected to the oxide semiconductor layer 140 (oxygen rich layer 141) through the contact holes formed in the channel protective layer 150. The source electrode 160s and the drain electrode 160d are arranged to oppose each other on the channel protective layer 150 so as to be spaced from each other in a direction horizontal to the substrate.

The source electrode 160s and the drain electrode 160d are each an electrode composed of an electrically conductive material. The material for the source electrode 160s and the drain electrode 160d is, for example, the same as those for the gate electrode 120.

Method for Manufacturing Thin Film Semiconductor Device

Next, a method for manufacturing a thin film semiconductor device according to this embodiment is described with reference to FIGS. 7A to 7G. FIGS. 7A to 7G are schematic cross-sectional views illustrating a method for manufacturing a thin film semiconductor device according to this embodiment.

First, as shown in FIG. 7A, a substrate 110 is prepared and a gate electrode 120 having a predetermined form is formed above the substrate 110. For example, a metal film is formed on the substrate 110 by a sputtering method. And the metal film is processed by a photolithography method and a wet etching method to form a gate electrode 120 having a predetermined form.

To be more specific, first, a glass substrate is prepared as the substrate 110. A molybdenum film (Mo film) and a copper film (Cu film) are sequentially formed on the substrate 110 by a sputtering method. Then the Mo film and the Cu film are patterned by a photolithography method and a wet etching method so as to form a gate electrode 120. The thickness of the gate electrode 120 is, for example, 20 nm to 500 nm. The Mo film and the Cu film may be wet-etched by using, for example, a chemical solution containing aqueous hydrogen peroxide ($H_2O_2$) and an organic acid.

Next, as shown in FIG. 7B, a gate insulating film 130 is formed above the substrate 110. For example, a gate insulating film 130 is formed on the substrate 110 and the gate electrode 120 by a plasma CVD method.

In particular, a silicon nitride film and a silicon oxide film are sequentially formed by a plasma CVD method on the substrate 110 so as to cover the gate electrode 120. As a result, a gate insulating film 130 is formed. The thickness of the gate insulating film 130 is, for example, 50 nm to 300 nm.

The silicon nitride film can be formed by using, for example, a silane gas ($SiH_4$), ammonia gas ($NH_3$), and nitrogen gas ($N_2$) as the introduced gas. The silicon oxide film can be formed by using silane gas ($SiH_4$) and nitrous oxide gas ($N_2O$) as the introduced gas.

Next, as shown in FIG. 7C, an oxide semiconductor film 140a is formed at a position above the substrate 110 and opposing the gate electrode 120. For example, an oxide semiconductor film 140a is formed on the gate insulating film 130 by a sputtering method. The thickness of the oxide semiconductor film 140a is, for example, 20 to 200 nm.

In particular, an amorphous InGaZnO film is formed on the gate insulating film 130 by a sputtering method using a target material having an In:Ga:Zn compositional ratio of 1:1:1 in an oxygen atmosphere.

Next, as shown in FIG. 7D, an oxide semiconductor layer 140 having a predetermined form is formed above the substrate 110. For example, the oxide semiconductor film 140a is patterned so as to form an oxide semiconductor layer 140 on the gate insulating film 130.

In particular, an amorphous InGaZnO film formed on the gate insulating film 130 is patterned by a photolithography method and a wet etching method so as to form an oxide semiconductor layer 140. The thickness of the oxide semiconductor layer 140 is, for example, 20 to 200 nm. The InGaZnO film may be wet-etched by using a chemical solution containing, for example, phosphoric acid ($H_3PO_4$), nitric acid ($HNO_3$), acetic acid ($CH_3COOH$), and water.

Next, as shown in FIG. 7E, a plasma treatment is performed by using oxygen-containing gas. For example, an oxygen rich layer 141 is formed in the oxide semiconductor layer 140 by exposing the oxide semiconductor layer 140 to plasma 170. The thickness of the oxygen rich layer 141 is, for example, 5 to 50 nm.

In particular, a plasma treatment is performed on the oxide semiconductor layer 140 by using nitrous oxide gas ($N_2O$) as the introduced gas at a power density of 0.2 [$W/cm^2$] or more and 1 [$W/cm^2$] or less and under pressure of 2.0 [Torr] or more. The time for the plasma treatment is, for example, 30 seconds to 5 minutes. The conditions for the plasma treatment are not limited to these. For example, the introduced gas may be oxygen gas ($O_2$), ozone gas ($O_3$), nitrogen dioxide gas ($NO_2$), or the like.

The region of the oxide semiconductor layer 140 exposed to the plasma by the plasma treatment forms an oxygen rich layer 141. As shown in FIG. 7E, the oxygen rich layer 141 is formed in the back channel region of the oxide semiconductor layer 140.

Next, as shown in FIG. 7F, a channel protective layer 150 is formed on the oxide semiconductor layer 140. For example, a channel protective layer 150 is formed on the oxide semiconductor layer 140 and the gate insulating film 130 so as to cover the oxide semiconductor layer 140 (oxygen rich layer 141).

In particular, a silicon oxide film is formed on the gate insulating film 130 by a plasma CVD method. A channel protective layer 150 is formed in this way. The thickness of the channel protective layer 150 is, for example, 50 to 500 nm.

The channel protective layer 150 is then patterned into a predetermined form. In particular, contact holes are formed in the channel protective layer 150 so as to expose part of the oxide semiconductor layer 140 (oxygen rich layer 141). For example, part of the channel protective layer 150 is etched away to form contact holes.

To be more specific, first, part of the channel protective layer 150 is etched away by a photolithography method and a dry etching method. As a result of this etching, contact holes are formed in regions that will form a source contact region and a drain contact region in the oxide semiconductor layer 140. For example, when the channel protective layer 150 is a silicon oxide film, a reactive ion etching (RIE) method can be employed as the dry etching method. The etching gas that can be used here is, for example, carbon tetrafluoride ($CF_4$) and oxygen gas ($O_2$). The parameters such as gas flow rate, pressure, applied power, and frequency are appropriately set in accordance with the substrate size and the thickness of the film to be etched.

Next, as shown in FIG. 7G, a source electrode 160s and a drain electrode 160d connected to the oxide semiconductor layer 140 are formed. For example, a source electrode 160s having a predetermined form and a drain electrode 160d having a predetermined form are formed on the channel protective layer 150 while filling the contact holes formed in the channel protective layer 150.

In particular, a source electrode 160s and a drain electrode 160d that are spaced from each other are formed on the channel protective layer 150 and in the contact holes. To be more specific, a Mo film, a Cu film, and a CuMn film are sequentially formed by a sputtering method on the channel protective layer 150 and in the contact holes. Then, the Mo film, the Cu film, and the CuMn film are patterned by a photolithography method and a wet etching method so as to form a source electrode 160s and a drain electrode 160d.

The thickness of the source electrode 160s and the drain electrode 160d is, for example, 100 nm to 500 nm. The Mo film, the Cu film, and the CuMn film can be wet-etched by using, for example, a chemical solution containing aqueous hydrogen peroxide ($H_2O_2$) and an organic acid.

As a result of performing the above-described processes, a thin film semiconductor device 100 is manufactured.

Relationship Between Density of States of Oxygen Defects and Plasma Treatment

First, a method for measuring the density of states of oxygen defects in oxide semiconductor layer 140 is described.

When transmission characteristics are measured by applying light to IGZO used as a material for the oxide semiconductor layer 140, an increase in current in an OFF region of the transmission characteristics and a negative shift in threshold voltage are observed. This is because oxygen defects (Vo) forming an energy level near a valence band in the band gap form divalent cations ($Vo^{2+}$) that form energy level near the conduction band by irradiation with light and release two electrons to the conduction band.

The amount of the negative shift in threshold voltage is dependent on the amount of oxygen defects in the band gap. The larger the amount of oxygen defects, the larger the amount of the shift in threshold voltage. Moreover, the energy of the applied light corresponds to the depth of the energy level of the oxygen defects (Vo) from the conduction band.

According to the method for measuring the density of states of oxygen defects, the transmission characteristics are first measured in a dark state. During this process, the transmission characteristics can be acquired by, for example, performing a sweep at a voltage step of 0.1 V in the gate-source voltage Vgs range of from −15 V to +15 V at a drain-source voltage Vds set to 4.1 V.

Next, the transmission characteristics under light irradiation (bright state) are evaluated. For example, light having an energy E of 2.0 eV, 2.3 eV, and 2.7 eV is applied to the oxide semiconductor layer 140 at a luminance of 100 μW/cm². Evaluation is sequentially performed from an oxygen defect level that exists at an energy level relatively shallow from the lower edge of the conduction band and having a relatively small optical response up to an oxygen defect level that exists at a deeper energy level. In order to perform the evaluation, the energy of light applied is increased stepwise from 2.0 eV to 2.3 eV and to 2.7 eV to measure the transmission characteristics under light irradiation at each light energy.

Then the threshold voltages Vth are calculated from the transmission characteristics obtained in the dark state and bright state. The threshold Vth is defined as the value of Vgs at the time when the drain-source current Ids satisfies Ids=(W/L)×1 nA where W represents a channel width and L represents a channel length. After normalized Vth in the dark state to the bright state are calculated, the density of states DOS [eV⁻¹cm⁻³] of oxygen defects is calculated by using formula (1):

$$DOS = \left(\frac{C}{qt}\right)\left(\frac{\Delta V_{th}}{\Delta E}\right) \quad \text{Formula (1)}$$

In the formula, C represents a gate insulating film capacitance per unit area, q represents an elementary charge t represents the thickness of a semiconductor film (thickness of the IGZO film), ΔVth represents the difference in Vth obtained in the respective measurements, for example, the difference between Vth obtained in the dark state and Vth obtained in the bright state, and ΔE represents the difference in light energy applied during measurement of the respective transmission characteristics, for example, the difference between the light energy E in the dark state and the light energy E in the bright state. The "dark state" corresponds to the measurement performed at a light energy E of 0 eV.

The relationship between the density of states of oxygen defects in the oxide semiconductor layer 140 and the plasma treatment will now be described with reference to FIGS. 8A to 9.

According to this embodiment, a resist is applied to a particular region on the oxide semiconductor film 140a and etching is performed so as to form the oxide semiconductor layer 140. Accordingly, the upper surface of the oxide semiconductor layer 140 is damaged by the resist and oxygen defects occur in the region that includes the upper surface of the oxide semiconductor layer 140. In particular, oxygen defects occur in the back channel region.

Figure 8A:
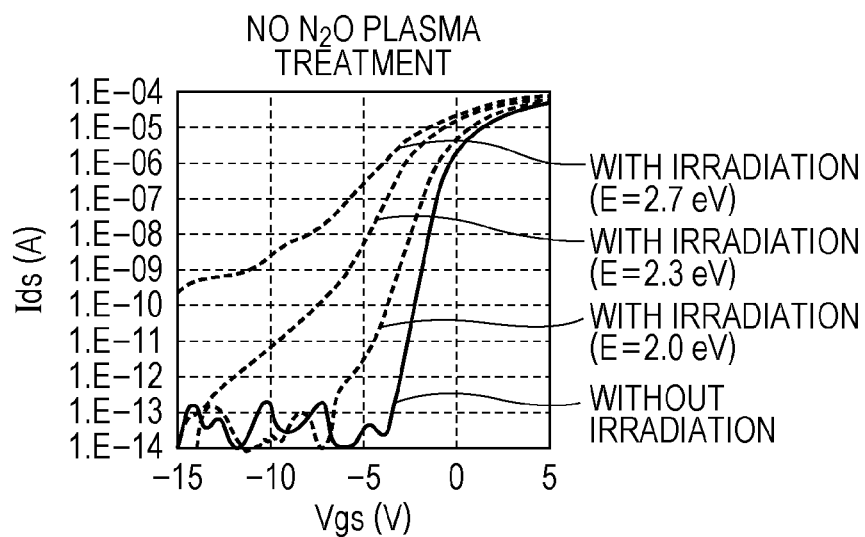
FIG. 8A is a graph showing transmission characteristics of a thin film semiconductor device according to Comparative Example.

FIG. 8A is a graph showing transmission characteristics of a thin film semiconductor device according to Comparative Example. The thin film semiconductor device according to Comparative Example is identical to the thin film semiconductor device of this embodiment except that a plasma treatment is not performed on the oxide semiconductor layer.

As shown in FIG. 8A, the transmission characteristics greatly change as the oxide semiconductor layer is irradiated with light. In particular, the drain-source current Ids against the same gate-source voltage Vgs tends to increase when the light is applied than when light is not applied. This is due to oxygen defects in the oxide semiconductor layer as discussed above. In other words, the larger the change in transmission characteristics induced by irradiation with light, the higher the density of states of oxygen defects in the oxide semiconductor layer.

In this embodiment, after the oxide semiconductor layer 140 is formed and before the channel protective layer 150 is formed, a plasma treatment is performed by using gas containing nitrous oxide so as to decrease the oxygen defects in the oxide semiconductor layer 140.

Figure 8B:
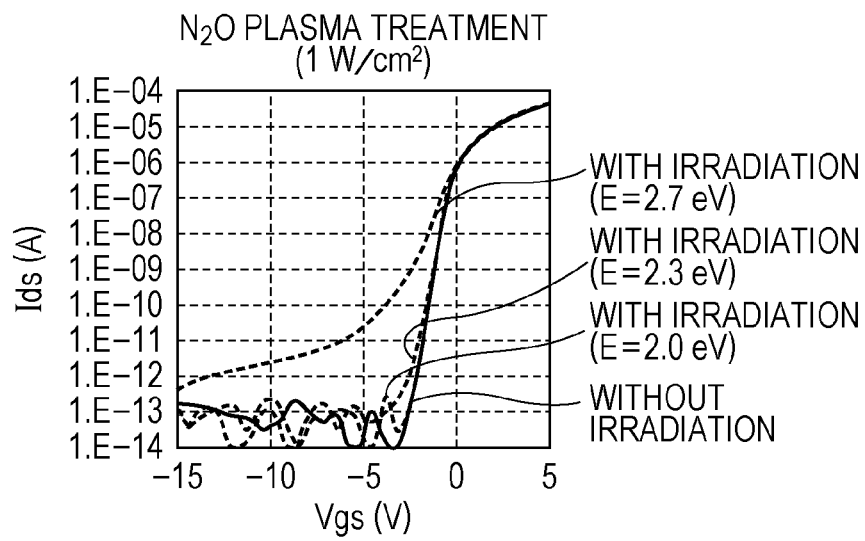
FIG. 8B is a graph showing transmission characteristics of a thin film semiconductor device according to the first embodiment.
Figure 8C:
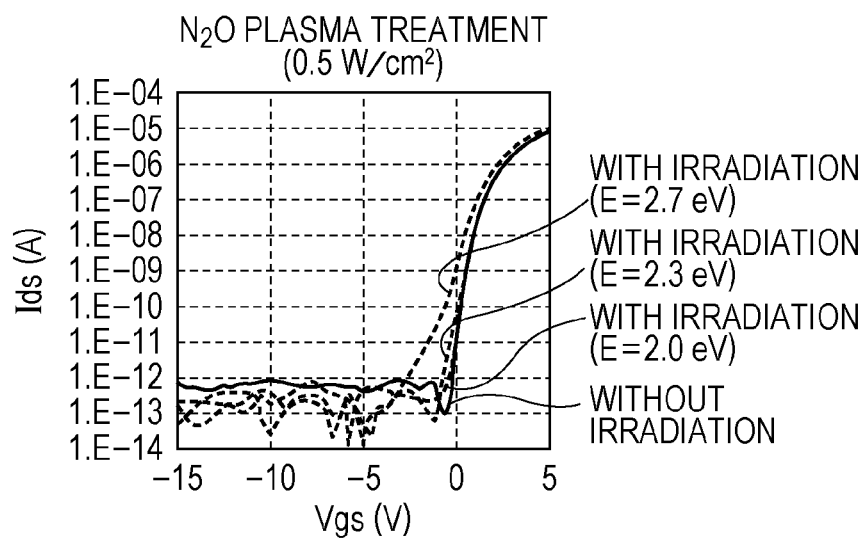
FIG. 8C is a graph showing transmission characteristics of a thin film semiconductor device according to the first embodiment.

FIGS. 8B and 8C are graphs showing transmission characteristics of thin film semiconductor devices according to this embodiment. That is, FIGS. 8B and 8C show the transmission characteristics of thin film semiconductor devices 100 in which a plasma treatment is performed on the oxide semiconductor layer 140. FIG. 8B shows the transmission characteristics of a thin film semiconductor device 100 manufactured at a power density of 1 [W/cm²] by using nitrous oxide gas (N₂O) as the introduced gas. FIG. 8C shows the transmission characteristics of a thin film semiconductor device 100 manufactured at a power density of 0.5 [W/cm²] by using nitrous oxide gas (N₂O) as the introduced gas.

Comparison of FIGS. 8A and 8B shows that the change in transmission characteristics that occurs when the oxide semiconductor layer is irradiated with light is suppressed by performing a plasma treatment using nitrous oxide gas (N₂O). The density of states of oxygen defects in the oxide semiconductor layer can be decreased by performing a plasma treatment using nitrous oxide gas (N₂O).

As shown in FIG. 8C, the change in transmission characteristics that occurs when the oxide semiconductor layer is irradiated with light is further suppressed by performing a plasma treatment at a lower power density. The density of states of oxygen defects in the oxide semiconductor layer can be further decreased by performing a plasma treatment using nitrous oxide gas (N₂O) at a low power density.

To be more specific, the density of states of oxygen defects in a thin film semiconductor device manufactured at a power density of 0.5 [W/cm²] is lower than that in a thin film semiconductor device manufactured at a power density of 1 [W/cm²].

Figure 9:
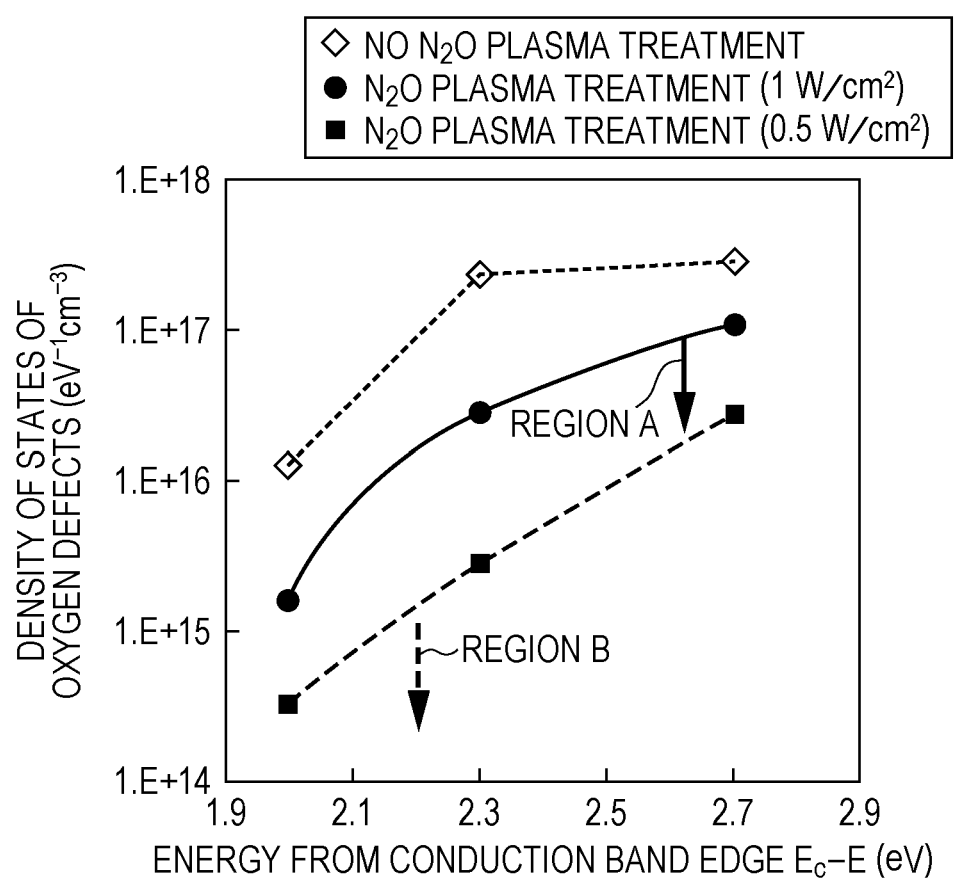
FIG. 9 is a graph showing a density of states of oxygen defects in an oxide semiconductor layer of a thin film semiconductor device according to the first embodiment.

FIG. 9 is a graph showing the density of states of oxygen defects in an oxide semiconductor layer of a thin film semiconductor device according to this embodiment.

For example, the density of states DOS [eV⁻¹cm⁻³] of oxygen defects in the oxide semiconductor layer 140 according to this embodiment satisfies formula (2) where Ec [eV] is the energy level at the conduction band edge of the oxide semiconductor layer 140 and E [eV] is a predetermined energy level of the oxide semiconductor layer 140. Note that formula (2) in this embodiment is in the range of 2.0≤Ec−E≤2.7.

$$DOS \leq 1.710 \times 10^{17} \times (Ec-E)^2 - 6.468 \times 10^{17} \times (Ec-E) + 6.113 \times 10^{17} \quad \text{Formula (2)}$$

This formula indicates the region (region A) below the bold solid line (the line at the middle) in FIG. 9. The bold solid line in FIG. 9 indicates the results of a plasma treatment performed on the oxide semiconductor layer 140 at a power density of 1 [W/cm²] by using nitrous nitrogen gas (N₂O) as the introduced gas.

In particular, the density of states DOS [eV⁻¹ cm⁻²] of oxygen defects in the oxide semiconductor layer 140 satisfies DOS [eV⁻¹cm⁻³]≤1.12×10¹⁷ when the energy Ec−E from the conduction band edge is 2.7 eV. The density of states DOS [eV⁻¹cm⁻³] of oxygen defects in the oxide semiconductor layer 140 satisfies DOS [eV⁻¹ cm⁻³]≤2.82×10¹⁶ when the energy Ec−E from the conduction band edge is 2.3 eV. The density of states DOS [eV⁻¹ cm⁻³] of oxygen defects in the oxide semiconductor layer 140 satisfies DOS [eV⁻¹cm⁻³]≤1.70×10¹⁵ when the energy Ec−E from the conduction band edge is 2.0 eV.

The density of states DOS [eV⁻¹cm⁻³] of oxygen defects in the oxide semiconductor layer 140 may satisfy formula (3)

where Ec [eV] is the energy level at the conduction band edge of the oxide semiconductor layer 140 and E [eV] is a predetermined energy level of the oxide semiconductor layer 140. In this embodiment, the formula (3) is in the range of 2.0≤Ec−E≤2.7.

$$DOS \leq 1.332 \times 10^{10} \times (Ec-E)^{14.65} \qquad \text{Formula (3)}$$

This formula indicates the region (region B) below the broken line (the line at the bottom) in FIG. 9. The broken line in FIG. 9 indicates the results of a plasma treatment performed on the oxide semiconductor layer 140 at a power density of 0.5 [W/cm$^2$] by using nitrous nitrogen gas (N$_2$O) as the introduced gas.

In particular, the density of states DOS [eV$^{-1}$cm$^{-3}$] of oxygen defects in the oxide semiconductor layer 140 satisfies DOS [eV$^{-1}$cm$^{-3}$]≤2.78×10$^{16}$ when the energy Ec−E from the conduction band edge is 2.7 eV. The density of states DOS [eV$^{-1}$cm$^{-3}$] of oxygen defects in the oxide semiconductor layer 140 satisfies DOS [eV$^{-1}$cm$^{-3}$]≤2.65×10$^{15}$ when the energy Ec−E from the conduction band edge is 2.3 eV. The density of states DOS [eV$^{-1}$cm$^{-3}$] of oxygen defects in the oxide semiconductor layer 140 satisfies DOS [eV$^{-1}$cm$^{-3}$]≤3.42×10$^{14}$ when the energy Ec−E from the conduction band edge is 2.0 eV.

The dot line (line at the top) in FIG. 9 indicates the density of states of oxygen defects in an oxide semiconductor layer not subjected to a plasma treatment. As shown in FIG. 9, the density of states of oxygen defects in the oxide semiconductor layer 140 can be decreased by performing a plasma treatment. The density of states of oxygen defects in the oxide semiconductor layer 140 can be further decreased by lowering the power density of the plasma treatment. Note that, as discussed above, the fact that a desired density of states of oxygen defects is obtained can be confirmed by evaluating transmission characteristics of the oxide semiconductor layer 140 irradiated with light (bright state).

Effect of Suppressing Decrease in Threshold Voltage

Next, the effect of suppressing a decrease in threshold voltage, which is achieved in the thin film semiconductor device 100 according to this embodiment, is described with reference to FIGS. 10A to 11.

Figure 10A:
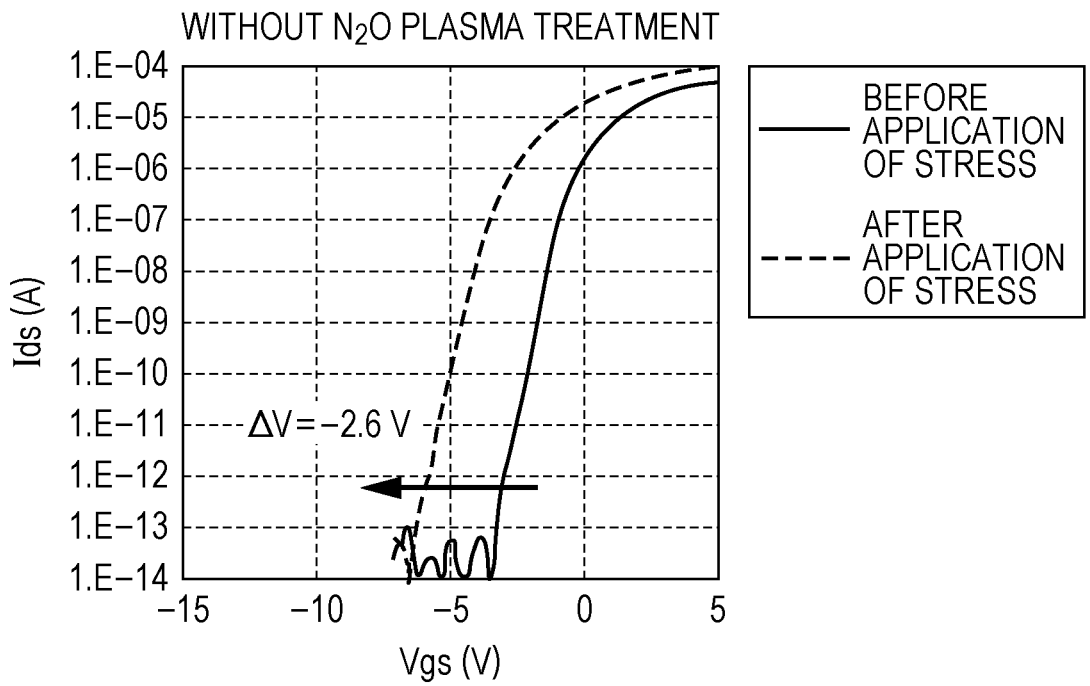
FIG. 10A is a graph showing transmission characteristics of a thin film semiconductor device according to Comparative Example before and after application of stress.

FIG. 10A is a graph showing the transmission characteristics of a thin film semiconductor device according to Comparative Example before and after application of stress. FIG. 10A shows the transmission characteristics of a thin film semiconductor device in which the oxygen semiconductor layer is not subjected to a plasma treatment with nitrous oxide gas (N$_2$O).

Figure 10B:
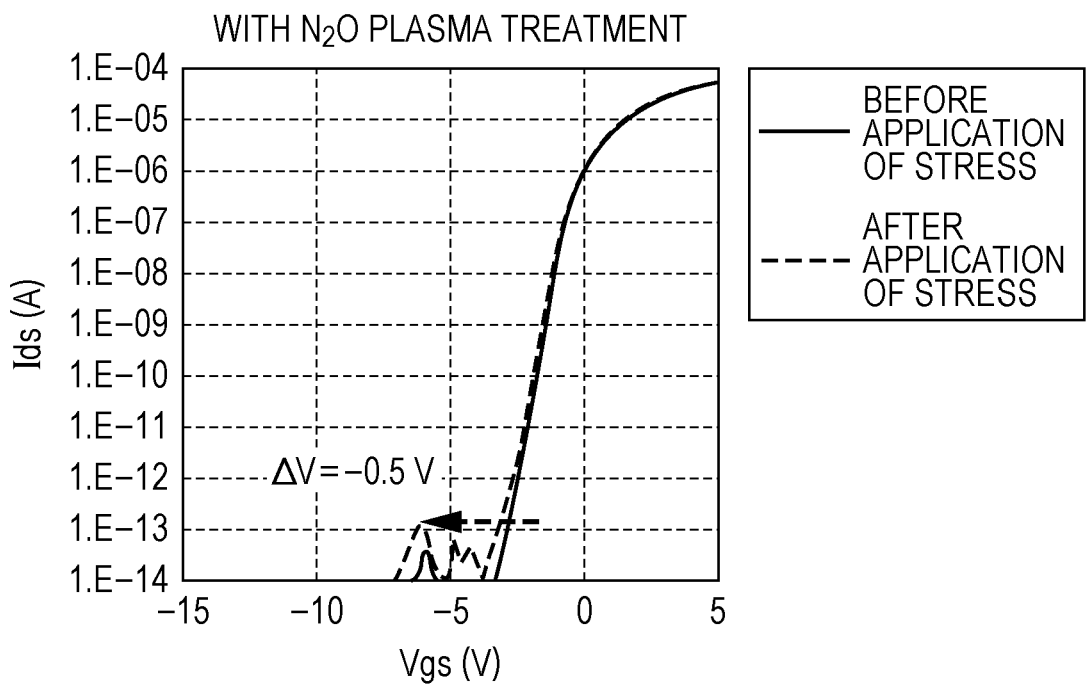
FIG. 10B is a graph showing transmission characteristics of a thin film semiconductor device according to the first embodiment before and after application of stress.

FIG. 10B is a graph showing the transmission characteristics of a thin film semiconductor device according to this embodiment before and after application of stress. FIG. 10B shows the transmission characteristics of a thin film semiconductor device in which the oxygen semiconductor layer 140 is subjected to a plasma treatment at a power density of 1 [W/cm$^2$] using nitrous oxide gas (N$_2$O) as the introduced gas.

The conditions of the stress applied in each case are as follows: gate-source voltage Vgs=−20 V, drain-source voltage Vds=0 V, temperature T=90° C., and time t=2000 sec.

As shown in FIG. 10A, the threshold voltage of the thin film semiconductor device not subjected to a plasma treatment using nitrous oxide gas (N$_2$O) decreases after application of stress. In particular, the threshold voltage decreased by 2.6 V after the application of stress from the threshold voltage before application of stress.

In contrast, as shown in FIG. 10B, the threshold voltage of the thin film semiconductor device subjected to a plasma treatment using nitrous oxide gas (N$_2$O) decreases little after application of stress. In particular, the threshold voltage after application of stress decreased by only 0.5 V from the threshold voltage before application of stress.

As discussed above, the decrease in threshold voltage after application of stress is suppressed when the oxide semiconductor layer 140 is subjected to a plasma treatment using nitrous oxide gas (N$_2$O). In other words, when an oxide semiconductor layer 140 that has a density of states satisfying formula (2) or formula (3) is included, the decrease in the threshold voltage of the thin film semiconductor device 100 is suppressed.

Figure 11:
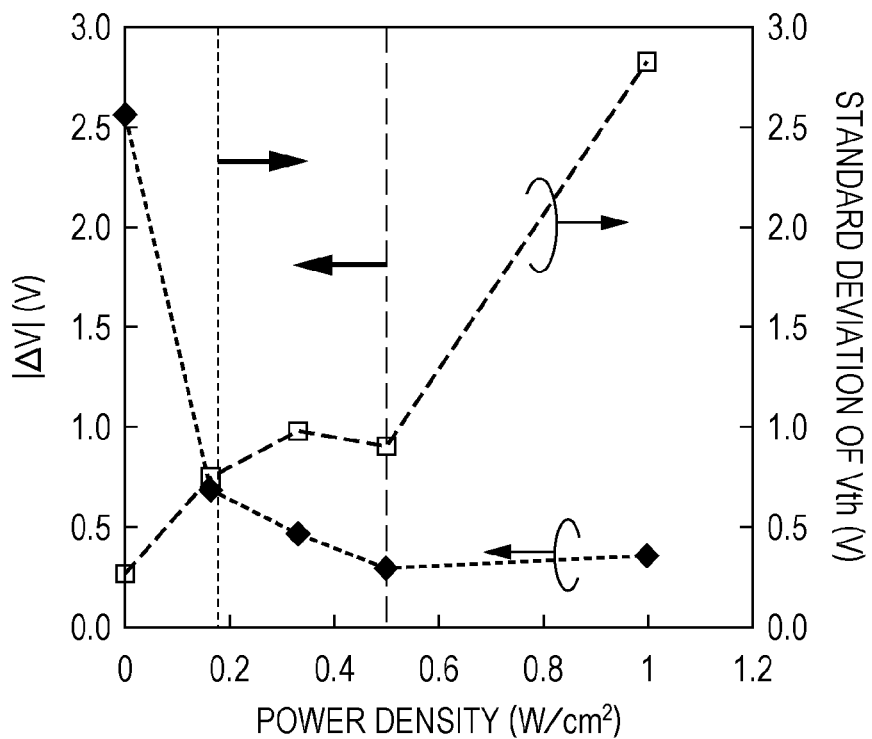
FIG. 11 is a graph showing a relationship between a power density of a plasma treatment and a threshold voltage according to the first embodiment.

FIG. 11 is a graph showing the relationship between the power density of the plasma treatment and the threshold voltage according to this embodiment.

As shown in FIG. 11, the change (|ΔV|) in threshold voltage is dependent on the power density of the plasma treatment with a minimum of about 0.5 [W/cm$^2$]. For example, the amount of change in threshold voltage is substantially constant in the power density range of 0.5 [W/cm$^2$] or more and 1 [W/cm$^2$] or less.

In the power density range of 0.2 [W/cm$^2$] or more and 0.5 [W/cm$^2$] or less, the amount of change in threshold voltage gradually increases with decreasing power density. In contrast, in the power density range of 0.2 [W/cm$^2$] or less, the amount of change in threshold voltage rapidly increases with the decreasing power density.

Accordingly, the power density may be in the range of 0.2 [W/cm$^2$] or more in order to suppress the amount of change in threshold voltage.

In contrast, the standard deviation of the threshold voltage Vth gradually increases with the increasing power density. In the power density range of 0.5 [W/cm$^2$] or more, the standard deviation of the threshold voltage increases rapidly.

Accordingly, the power density may be in the range of 0.5 [W/cm$^2$] or less in order to suppress the standard deviation of the threshold voltage.

In view of the above, in order to suppress the negative shift of the threshold voltage and manufacture a thin film semiconductor device 100 having stable characteristics, the power density may be 1 [W/cm$^2$] or less as shown in FIG. 10B. Similarly, in order to suppress the negative shift of the threshold voltage and manufacture a thin film semiconductor device 100 having stable characteristics, the power density may be 0.2 [W/cm$^2$] or more as shown in FIG. 11. Alternatively, as shown in FIG. 11, the power density may be 0.2 [W/cm$^2$] or more and 0.5 [W/cm$^2$] or less.

In other words, the decrease in the threshold voltage of the thin film semiconductor device 100 is suppressed when the thin film semiconductor device 100 includes an oxide semiconductor layer 140 having a density of states of oxygen defects satisfying formula (2) or formula (3). Accordingly, the thin film semiconductor device 100 can exhibit more stable characteristics and higher reliability. Accordingly, when the thin film semiconductor device 100 is used as a drive transistor of a display for example, the luminance variation can be suppressed.

Effect of Suppressing Mobility Curve Peak

The effect of suppressing a mobility peak achieved by the thin film semiconductor device 100 of this embodiment will now be described with reference to FIG. 12.

Figure 12:
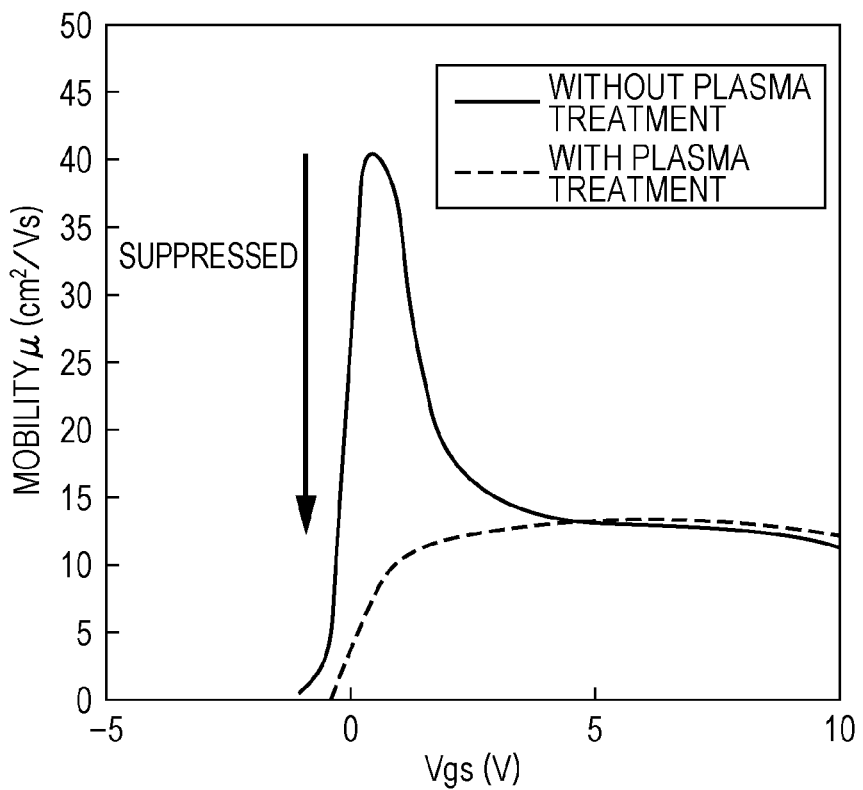
FIG. 12 is a graph showing mobility-voltage characteristics of a thin film semiconductor device according to the first embodiment.

FIG. 12 is a graph showing mobility-voltage characteristics of a thin film semiconductor device according to this embodiment.

The resistance of the back channel region of the oxide semiconductor layer decreases due to oxygen defects occurred in the oxide semiconductor layer. Since the density of states of oxygen defects in the oxide semiconductor layer stays high if no plasma treatment using nitrous oxide gas (N$_2$O) is performed, a mobility curve peak emerges.

In contrast, in the case where a plasma treatment is performed using nitrous oxide gas (N$_2$O), the density of states of oxygen defects in the oxide semiconductor layer decreases and the decrease in resistance in the back channel region is suppressed. Accordingly, as shown in FIG. 12, the mobility curve peak is suppressed by performing a plasma treatment using nitrous oxide gas (N$_2$O).

Figure 13:
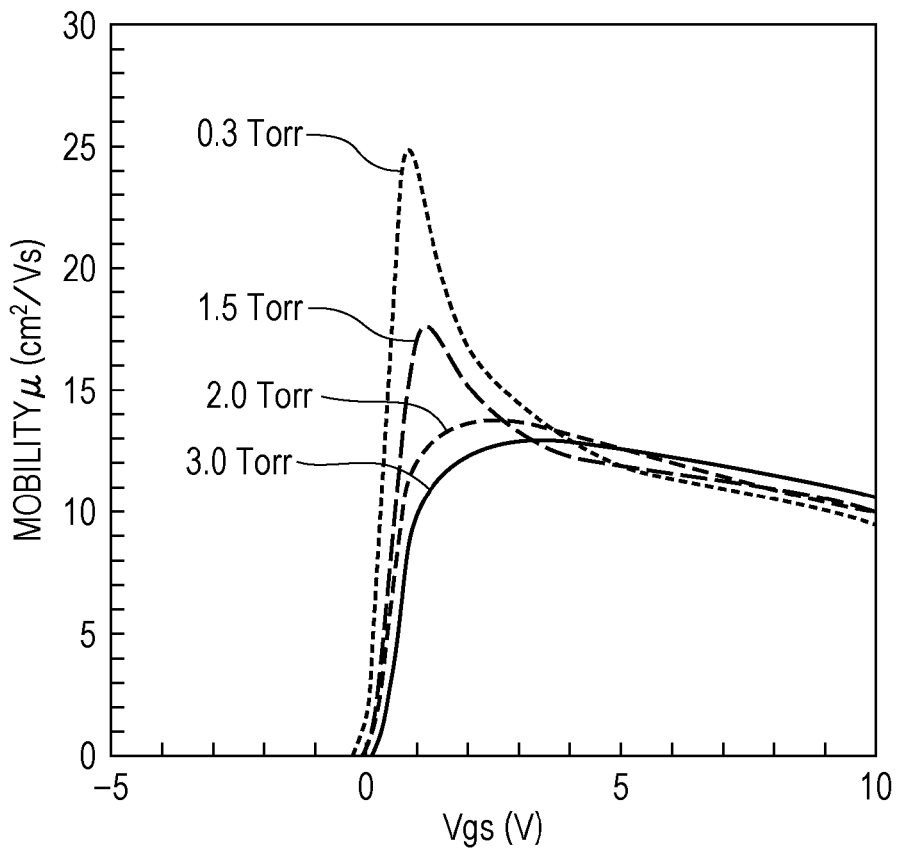
FIG. 13 is a graph showing a relationship between pressure conditions of a plasma treatment and mobility according to the first embodiment.

FIG. 13 is a graph showing the relationship between the pressure condition of the plasma treatment and the mobility according to this embodiment. In particular, FIG. 13 shows the mobility μ [cm$^2$/Vs] exhibited when the oxide semiconductor layer 140 is subjected to a plasma treatment at a pressure of 0.3 [Torr] to 3.0 [Torr].

As shown in FIG. 13, the higher the pressure, the more suppressed is the mobility curve peak. In other words, the mobility curve peak can be further suppressed by performing a plasma treatment using nitrous oxide gas (N$_2$O) at a higher pressure. For example, the mobility curve peak can be suppressed by performing a plasma treatment at a pressure of 2.0 [Torr] or more. The plasma treatment may be performed at a pressure of 3.0 [Torr] or more. Alternatively, the plasma treatment may be performed at a pressure of 1.5 [Torr] or more.

As discussed above, the mobility curve peak can be suppressed by performing a plasma treatment at a pressure higher than a predetermined pressure. Accordingly, a thin film semiconductor device having more stable characteristics can be manufactured by performing a plasma treatment at a pressure higher than the predetermined pressure.

As discussed above, a thin film semiconductor device according to this embodiment includes a substrate, a gate electrode formed above the substrate, an oxide semiconductor layer formed above the substrate so as to oppose the gate electrode, a first insulating layer formed on the oxide semiconductor layer, and a source electrode and a drain electrode connected to the oxide semiconductor layer, in which a density of states DOS [eV$^{-1}$cm$^{-3}$] of oxygen defects in the oxide semiconductor layer satisfies DOS≤1.710×10$^{17}$×(Ec−E)$^2$− 6.468×10$^{17}$×(Ec−E)+6.113×10$^{17}$ provided that 2.0 eV≤Ec−E≤2.7 eV where Ec [eV] is an energy level at a conduction band edge of the oxide semiconductor layer and E [eV] is a predetermined energy level of the oxide semiconductor layer.

Since the density of states of oxygen defects in the oxide semiconductor layer is small, a negative shift in threshold voltage can be decreased and the mobility curve peak can be decreased. Accordingly, a thin film semiconductor device having more stable characteristics can be manufactured. In particular, a bottom-gate, channel-protective thin film transistor having more stable characteristics can be manufactured. When the thin film transistor is used as a drive transistor of a display, luminance variation can be suppressed.

Second Embodiment

Next, a second embodiment is described. An organic EL display device according to this embodiment has the same structure as the organic EL display device 10 of the first embodiment. Thus, the description therefor is omitted to avoid redundancy. A thin film semiconductor device is described below.

Thin Film Semiconductor Device

A thin film semiconductor device according to this embodiment will now be described. A thin film semiconductor device according to this embodiment is a bottom-gate, channel-etch thin film transistor.

Figure 14:
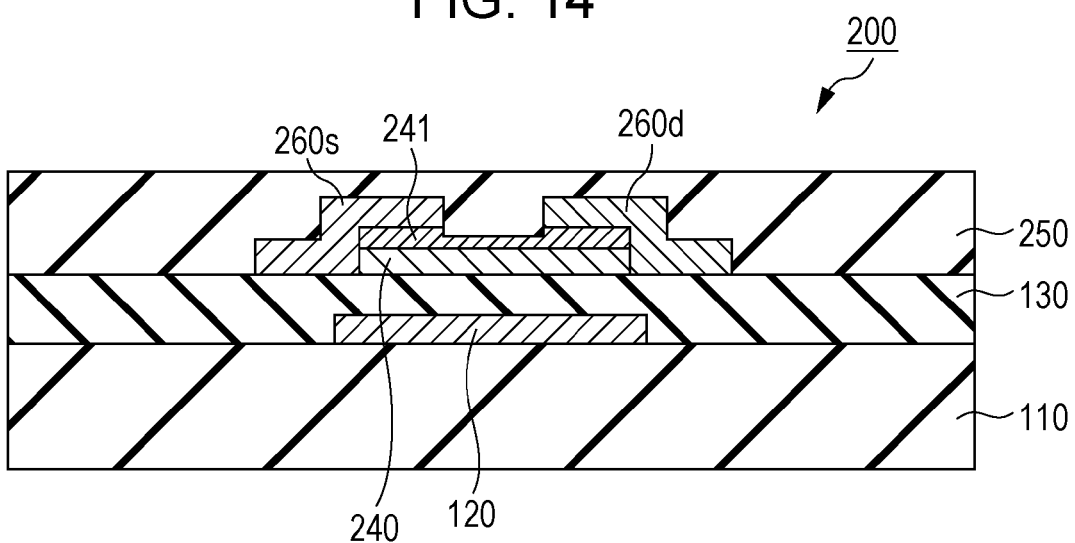
FIG. 14 is a schematic cross-sectional view of a thin film semiconductor device according to a second embodiment.

FIG. 14 is a schematic cross-sectional view of a thin film semiconductor device according to this embodiment.

As shown in FIG. 14, a thin film semiconductor device 200 according to this embodiment includes a substrate 110, a gate electrode 120, a gate insulating film 130, an oxide semiconductor layer 240, a channel protective layer 250, a source electrode 260s, and a drain electrode 260d. The oxide semiconductor layer 240 includes an oxygen rich layer 241. Some structures that are substantially identical to those of the first embodiment are not described to avoid redundancy.

The oxide semiconductor layer 240 is formed above the substrate 110 so as to oppose the gate electrode 120. In particular, the oxide semiconductor layer 240 is formed on the gate insulating film 130 so as to face the gate electrode 120. For example, an oxide semiconductor layer 240 having an island form is formed on the gate insulating film 130 and above the gate electrode 120. The same material used for forming the oxide semiconductor layer 140 in the first embodiment can be used as the material for the oxide semiconductor layer 240.

As shown in FIG. 14, the oxygen rich layer 241 is formed in a back channel region of the oxide semiconductor layer 240. The oxygen rich layer 241 is a region of the oxide semiconductor layer 240 where oxygen defects are few. And the oxygen rich layer 241 is formed by performing a plasma treatment.

The density of states DOS [eV$^{-1}$cm$^{-3}$] of oxygen defects in the oxide semiconductor layer 240 satisfies, for example, formula (2). Alternatively, the density of states DOS [eV$^{-1}$cm$^{-3}$] of oxygen defects in the oxide semiconductor layer 240 may satisfy formula (3). As a result, as in the first embodiment, the density of states of oxygen defects in the oxide semiconductor layer 240 is low. Accordingly, the negative shift in threshold voltage and the mobility curve peak are decreased. Accordingly, the thin film semiconductor device 200 exhibits more stable characteristics.

The channel protective layer 250 is an example of a first insulating layer formed on the oxide semiconductor layer 240. For example, the channel protective layer 250 is formed on the oxide semiconductor layer 240, the source electrode 260s, the drain electrode 260d, and the gate insulating film 130 so as to cover the oxide semiconductor layer 240, the source electrode 260s, and the drain electrode 260d. The material for the channel protective layer 250 may be, for example, the same as that of the oxide semiconductor layer 140 of the first embodiment.

The source electrode 260s and the drain electrode 260d are in predetermined forms and formed on the oxide semiconductor layer 240. In particular, the source electrode 260s and the drain electrode 260d are arranged to oppose each other with a space therebetween in the direction horizontal to the substrate on the oxide semiconductor layer 240 (oxygen rich layer 241). As shown in FIG. 14, the source electrode 260s and the drain electrode 260d are formed on the oxide semiconductor layer 240 and the gate insulating film 130 so as to cover the end surfaces of the oxide semiconductor layer 240 in the direction horizontal to the substrate. For example, the same material as the gate electrode 120 can be used as the material for the source electrode 260s and the drain electrode 260d.

Method for Manufacturing Thin Film Semiconductor Device

A method for manufacturing a thin film semiconductor device according to this embodiment will now be described with reference to FIGS. 15A to 15H. FIGS. 15A to 15H are schematic cross-sectional views illustrating a method for manufacturing a thin film semiconductor device according to this embodiment.

Figure 15A:
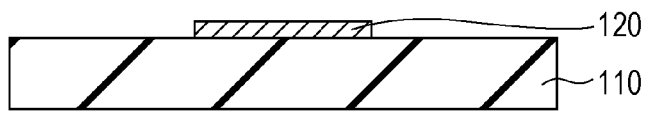
FIGS. 15A to 15H are schematic cross-sectional views illustrating a method for manufacturing a thin film semiconductor device according to the second embodiment.
Figure 15B:
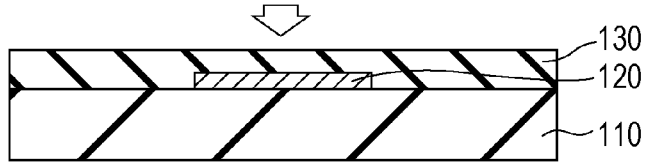
Figure 15C:
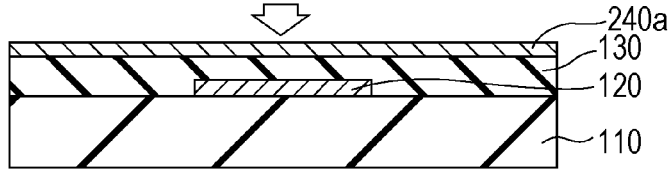
Figure 15D:
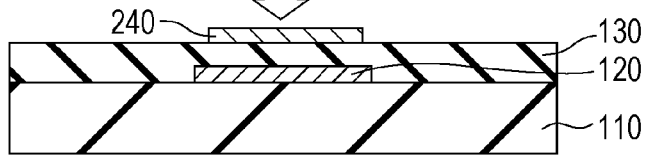
Figure 15E:
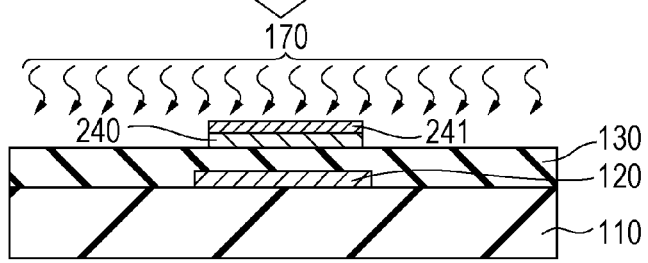

Formation of the gate electrode 120 shown in FIG. 15A and formation of the gate insulating film 130 shown in FIG. 15B are the same as those of the first embodiment and thus the description therefor is omitted (refer to FIGS. 7A and 7B). Formation of an oxide semiconductor film 240a shown in FIG. 15C, formation of the oxide semiconductor layer 240 shown in FIG. 15D, and a plasma treatment shown in FIG. 15E are also substantially the same as those of the first embodiment and the description therefor is omitted (refer to FIGS. 7C to 7E). Here, the oxide semiconductor film 240a, the oxide semiconductor layer 240, and the oxygen rich layer 241 respectively correspond to the oxide semiconductor film 140a, the oxide semiconductor layer 140, and the oxygen rich layer 141.

Figure 15F:
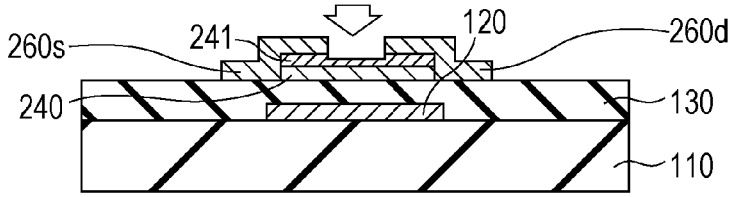

Next, as shown in FIG. 15F, a source electrode 260s and a drain electrode 260d are formed on the oxide semiconductor layer 240 (oxygen rich layer 241). For example, a source electrode 260s and a drain electrode 260d are formed on the oxide semiconductor layer 240 and the gate insulating film 130 so as to cover the end surfaces of the oxide semiconductor layer 240 and to be spaced from each other in the direction horizontal to the substrate.

In particular, a Mo film, a Cu film, and a CuMn film are sequentially formed on the oxide semiconductor layer 240 and the gate insulating film 130 by a sputtering method. The Mo film, the Cu film, and the CuMn film are patterned by a photolithography method and a wet etching method so as to form a source electrode 260s and a drain electrode 260d.

The thickness of the source electrode 260s and the drain electrode 260d is, for example, 100 nm to 500 nm. The Mo film, the Cu film, and the CuMn film can be wet-etched by using a chemical solution containing aqueous hydrogen peroxide ($H_2O_2$) and an organic acid.

At this stage, a part of the upper surface of the oxide semiconductor layer 240 (oxygen rich layer 241) is sometimes removed by etching. Oxygen defects occur in the oxide semiconductor layer 240 as a result of such etching.

Figure 15G:
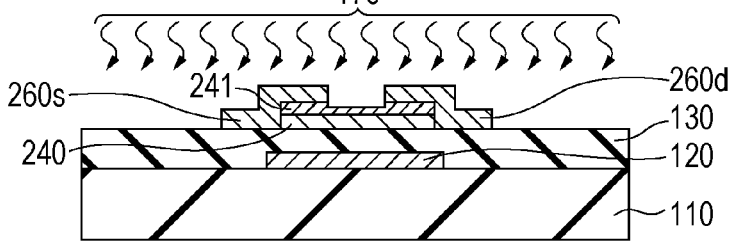

Next, as shown in FIG. 15G, a plasma treatment is performed by using oxygen-containing gas. Because of this plasma treatment, oxygen defects caused by the damage inflicted by etching in forming the source electrode 260s and the drain electrode 260d can be decreased.

In particular, the oxide semiconductor layer 240 is subjected to a plasma treatment using nitrous oxide gas ($N_2O$) as the introduced gas at a power density of 0.2 [$W/cm^2$] or more and 1 [$W/cm^2$] or less and at a pressure of 2.0 [Torr] or more. The time for the plasma treatment is, for example, 30 seconds to 5 minutes. The conditions for performing a plasma treatment are not limited to these. For example, the introduced gas may be oxygen gas ($O_2$), ozone gas ($O_3$), nitrogen dioxide gas ($NO_2$), or the like.

Figure 15H:
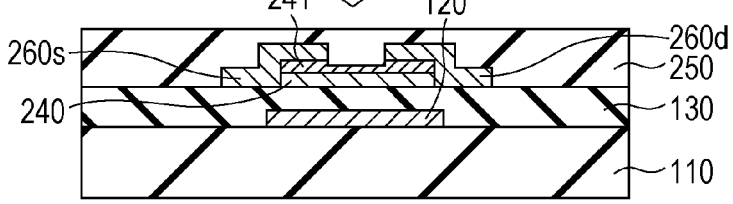

Next, as shown in FIG. 15H, a channel protective layer 250 is formed on the oxide semiconductor layer 240, the source electrode 260s, and the drain electrode 260d. For example, a channel protective layer 250 is formed on the gate insulating film 130 so as to cover the oxide semiconductor layer 240 (oxygen rich layer 241), the source electrode 260s, and the drain electrode 260d.

In particular, a channel protective layer 250 can be formed by forming a silicon oxide film on the gate insulating film 130 by a plasma CVD method. The thickness of the channel protective layer 250 is, for example, 50 to 500 nm.

As a result of performing the above-described processes, a thin film semiconductor device 200 is manufactured.

As in the first embodiment, the density of states of oxygen defects in the oxide semiconductor layer can be sufficiently decreased by performing a plasma treatment using oxygen-containing gas. Since the density of states of oxygen defects in the oxide semiconductor layer is small, the negative shift in threshold voltage can be decreased and the mobility curve peak can be decreased. Accordingly, a bottom-gate, channel-etch thin film transistor having more stable characteristics can be manufactured. When the thin film transistor is used as a drive transistor of a display, luminance variation can be suppressed.

Third Embodiment

Next, a third embodiment is described. An organic EL display device according to this embodiment has the same structure as the organic EL display device 10 of the first embodiment. Thus, the description therefor is omitted to avoid redundancy. A thin film semiconductor device is described below.

Thin Film Semiconductor Device

A thin film semiconductor device of this embodiment will now be described. A thin film semiconductor device according to this embodiment is a top-gate thin film transistor.

Figure 16:
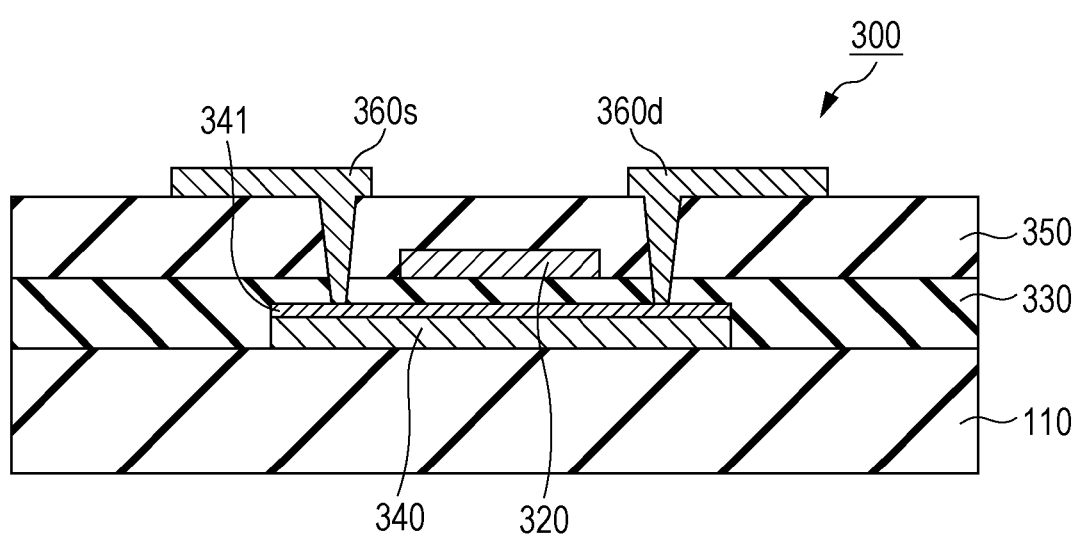
FIG. 16 is a schematic cross-sectional view of a thin film semiconductor device according to a third embodiment.

FIG. 16 is a schematic cross-sectional view of a thin film semiconductor device according to this embodiment.

As shown in FIG. 16, a thin film semiconductor device 300 according to this embodiment includes a substrate 110, a gate electrode 320, a gate insulating film 330, an oxide semiconductor layer 340, an insulating layer 350, a source electrode 360s, and a drain electrode 360d. The oxide semiconductor layer 340 includes an oxygen rich layer 341. Some structures that are substantially identical to those of the first embodiment are not described to avoid redundancy.

A gate electrode 320 having a predetermined form is formed above the substrate 110. In particular, the gate electrode 320 is formed on the gate insulating film 330 at a position opposing the oxide semiconductor layer 340. The material for the gate electrode 320 may be the same material as that for the gate electrode 120 of the first embodiment.

The gate insulating film 330 is an example of a first insulating film formed on the oxide semiconductor layer 340. For example, a gate insulating film 330 is formed on the oxide semiconductor layer 340 and the substrate 110 so as to cover the oxide semiconductor layer 340. In other words, the gate electrode 320 is formed above the oxide semiconductor layer 340 so as to oppose the oxide semiconductor layer 340. The material for the gate insulating film 330 is, for example, the same as that for the gate insulating film 130 in the first embodiment.

Holes are formed in part of the gate insulating film 330 so as to penetrate through the gate insulating film 330. In other words, contact holes for exposing part of the oxide semiconductor layer 340 (oxygen rich layer 341) are formed in the gate insulating film 330.

The oxide semiconductor layer 340 is formed on the substrate 110. In particular, an oxide semiconductor layer 340 having an island form is formed on the substrate 110. The material for the oxide semiconductor layer 340 is, for example, the same as that for the oxide semiconductor layer 140 in the first embodiment.

As shown in FIG. 16, the oxygen rich layer 341 is formed in the front-channel-side region of the oxide semiconductor layer 340 (hereinafter this region is referred to as the front channel region). The oxygen rich layer 341 is a region having fewer oxygen defects among the oxide semiconductor layer 340 and is formed by a plasma treatment. The front channel region is defined as a region in the oxide semiconductor layer that opposes the gate electrode (the region on the opposite side of the back channel region).

The density of states DOS [eV$^{-1}$cm$^{-3}$] of oxygen defects in the oxide semiconductor layer 340 satisfies, for example, formula (2). Alternatively, the density of states DOS [eV$^-$ $_1$cm$^{-3}$] of oxygen defects in the oxide semiconductor layer 340 may satisfy formula (3). As a result, as in the first embodiment, the density of states of oxygen defects in the oxide semiconductor layer 340 is decreased and the negative shift in threshold voltage and the mobility curve peak are decreased. Accordingly, the thin film semiconductor device 300 exhibits more stable characteristics.

The insulating layer 350 is formed on the gate electrode 320 and the gate insulating film 330. For example, the insulating layer 350 is formed on the gate electrode 320 and the gate insulating film 330 so as to cover the gate electrode 320. The material for the insulating layer 350 is, for example, the same as that for the channel protective layer 150 in the first embodiment.

Holes that penetrate through the insulating layer 350 are formed in a part of the insulating layer 350. In other words, contact holes are formed in the insulating layer 350. The oxide semiconductor layer 340 (oxygen rich layer 341) is connected to the source electrode 360s and the drain electrode 360d through the contact holes formed in the insulating layer 350 and the contact holes formed in the gate insulating film 330.

The source electrode 360s and the drain electrode 360d are in predetermined forms and are formed on the insulating layer 350. In particular, the source electrode 360s and the drain electrode 360d are connected to the oxide semiconductor layer 340 (oxygen rich layer 341) through contact holes formed in the insulating layer 350 and the gate insulating film 330. The source electrode 360s and the drain electrode 360d are arranged to oppose each other with a space therebetween in the direction horizontal to the substrate on the insulating layer 350. The material for the source electrode 360s and the drain electrode 360d may be, for example, the same as the material for the gate electrode 320.

Method for Manufacturing Thin Film Semiconductor Device

A method for manufacturing a thin film semiconductor device according to this embodiment will now be described with reference to FIGS. 17A to 17G. FIGS. 17A to 17G are schematic cross-sectional views illustrating a method for manufacturing a thin film semiconductor device according to this embodiment.

First, as shown in FIG. 17A, a substrate 110 is prepared and an oxide semiconductor film 340a is formed on the substrate 110. For example, an oxide semiconductor film 340a is formed on the substrate 110 by a sputtering method. The thickness of the oxide semiconductor film 340a is, for example, the same as that of the oxide semiconductor film 140a in the first embodiment.

Next, as shown in FIG. 17B, an oxide semiconductor layer 340 in a predetermined form is formed on the substrate 110. For example, an oxide semiconductor layer 340 is formed by patterning the oxide semiconductor film 340a. The specific patterning method may be the same as that used in forming the oxide semiconductor layer 140, for example.

Next, as shown in FIG. 17C, a plasma treatment is performed by using oxygen-containing gas. For example, the oxide semiconductor layer 340 is exposed to a plasma 170 to form an oxygen rich layer 341 in the oxide semiconductor layer 340. The thickness of the oxygen rich layer 341 is, for example, 5 to 50 nm. The plasma treatment conditions such as introduced gas, power density, pressure, and the like, are, for example, the same as those of the first embodiment.

As a result of performing a plasma treatment on the oxide semiconductor layer 340, an oxygen rich layer 341 is formed in the region exposed to the plasma. As shown in FIG. 17C, the oxygen rich layer 341 is formed in the front channel region of the oxide semiconductor layer 340.

Next, as shown in FIG. 17D, a gate insulating film 330 is formed on the oxide semiconductor layer 340. For example, a gate insulating film 330 is formed on the oxide semiconductor layer 340 and the substrate 110 by a plasma CVD method so as to cover the oxide semiconductor layer 340 (oxygen rich layer 341). The thickness of the gate insulating film 330 is, for example, the same as that of the gate insulating film 130 in the first embodiment.

Next, as shown in FIG. 17E, a gate electrode 320 is formed above the substrate 110. For example, a metal film is formed on the gate insulating film 330 by a sputtering method and then processed through a photolithography method and a wet etching method so as to form a gate electrode 320 having a predetermined form. The gate electrode 320 is formed at a position that opposes the oxide semiconductor layer 340. The thickness of the gate electrode 320 is, for example, the same as that of the gate electrode 120 in the first embodiment.

Next, as shown in FIG. 17F, an insulating layer 350 is formed on the gate electrode 320. For example, an insulating layer 350 is formed on the gate electrode 320 and the gate insulating film 330 so as to cover the gate electrode 320. The thickness of the insulating layer 350 is, for example, the same as that of the channel protective layer 150 in the first embodiment.

The insulating layer 350 and the gate insulating film 330 are patterned so as to have predetermined forms. In particular, contact holes are formed in the insulating layer 350 and the gate insulating film 330 so as to expose part of the oxide semiconductor layer 340 (oxygen rich layer 341). For example, contact holes are formed by etching away part of the insulating layer 350 and the gate insulating film 330.

To be specific, first, part of the insulating layer 350 and the gate insulating film 330 are etched by a photolithography method and a dry etching method. As a result of this etching, contact holes are formed in regions that will form a source contact region and a drain contact region of the oxide semiconductor layer 340. For example, in the case where the insulating layer 350 and the gate insulating film 330 are silicon oxide films, a reactive ion etching (RIE) method may be employed as a dry etching method. The etching gas that can be used in dry etching is, for example, carbon tetrafluoride ($CF_4$) and oxygen gas ($O_2$). The parameters such as gas flow rate, pressure, applied power, and frequency are appropriately set depending on the substrate size, thickness of the film to be etched, etc.

Next, as shown in FIG. 17G, a source electrode 360s and a drain electrode 360d connected to the oxide semiconductor layer 340 are formed. For example, a source electrode 360s and a drain electrode 360d having predetermined forms are formed on the insulating layer 350 while filling the contact holes formed in the insulating layer 350 and the gate insulating film 330.

In particular, a source electrode 360s and a drain electrode 360d are formed on the insulating layer 350 and in the contact holes so as be spaced from each other. To be more specific, a Mo film, a Cu film, and a CuMn film are sequentially formed on the insulating layer 350 and in the contact holes by a sputtering method. The Mo film, the Cu film, and the CuMn film are then patterned by a photolithography method and a wet etching method so as to form a source electrode 360s and a drain electrode 360d. The thickness of the source electrode 360s and the drain electrode 360d is, for example, the same as that of the source electrode 160s and the drain electrode 160d in the first embodiment.

As a result of performing the above-described processes, a thin film semiconductor device 300 is manufactured.

As in the first embodiment, the density of states of oxygen defects in the oxide semiconductor layer is low due to a plasma treatment using oxygen-containing gas. Accordingly, the negative shift in threshold voltage can be decreased and the mobility curve peak can be decreased. Thus, a top-gate thin film transistor having more stable characteristics can be manufactured. When the thin film transistor is used as a drive transistor of a display, luminance variation can be suppressed.

Other Embodiments

The first to third embodiments have been described as illustrative examples of the technology disclosed in this application. However, the technology in this disclosure is not limited to these embodiments and can be applied to other embodiments which involve appropriate alterations, substitutions, additions, omissions, and the like.

For example, in the embodiments above, a plasma treatment that uses nitrous oxide gas ($N_2O$) as the introduced gas and conditions thereof are described. However, the treatment and conditions are not limited to these. Different pressure conditions and power density conditions may be employed in the plasma treatment depending on the gas used in the plasma treatment. For example, the conditions that form an oxide semiconductor layer with a density of states of oxygen defects satisfying formula (2) or formula (3) may be appropriately selected depending on the type of gas used in the treatment.

In the first embodiment, contact holes for the source electrode 160s and the drain electrode 160d are formed in the channel protective layer 150 after an insulating film was formed on the entire surface as shown in FIGS. 7F and 7G. However, formation of the contact holes is not limited to this. For example, a channel protective layer 150 that has previously been patterned into a predetermined form so as to expose the oxide semiconductor layer 140 may be formed.

In other words, in the step of forming a channel protective layer 150, it is sufficient if a channel protective layer 150 is formed so as to expose a part of the oxide semiconductor layer 140. Moreover, in the step of forming a source electrode 160s and a drain electrode 160d, it is sufficient if a source electrode 160s and a drain electrode 160d are formed so as to connect to the oxide semiconductor layer 140 through the exposed portion.

The same applies to formation of the layers, such as the oxide semiconductor layer 140, that need to be patterned into predetermined forms. That is, instead of performing patterning after forming a film on the entire surface, an oxide semiconductor layer 140 that has been previously patterned into a predetermined form may be formed. This applies to other embodiments also.

In the above-discussed embodiments, the oxide semiconductor used to form the oxide semiconductor layer is not limited to amorphous IGZO. For example, a polycrystalline semiconductor such as polycrystalline InGaO can be used.

In the above-discussed embodiments, an organic EL display device is described as a display device that includes a thin film semiconductor device. However, the thin film semiconductor devices described in these embodiments can also be applied to other types of display devices that use active matrix substrates, such as liquid crystal display devices.

The display devices (display panels) such as the organic EL display devices described above can be used as flat panel displays. The display devices can also be applied to all types of electronic appliances having display panels, such as television sets, personal computers, and cellular phones. In particular, the display devices are suitable for use in large-screen, high-definition display devices.

The present invention encompasses individual embodiments and modifications with a variety of alterations conceivable by persons skilled in the art. The present invention also encompasses embodiments realized by freely combining the structural elements and functions in the embodiments and modifications.

A thin film semiconductor device and a method for manufacturing the thin film semiconductor device according to this disclosure can be used in, for example, a display device such as an organic EL display device.

What is claimed is:

1. A thin film semiconductor device comprising:
   a substrate;
   a gate electrode disposed above the substrate;
   an oxide semiconductor layer disposed above the substrate so as to oppose the gate electrode;
   a first insulating layer disposed on the oxide semiconductor layer; and
   a source electrode and a drain electrode each connected to the oxide semiconductor layer,
   wherein a density of states DOS [$eV^{-1}cm^{-2}$] of oxygen defects in the oxide semiconductor layer satisfies the following relationship:

$$DOS \leq 1.710 \times 10^{17} \times (Ec-E)^2 - 6.468 \times 10^{17} \times (Ec-E) + 6.113 \times 10^{17}$$

provided that $2.0\ eV \leq Ec-E \leq 2.7\ eV$
   where Ec [eV] is an energy level of a conduction band edge of the oxide semiconductor layer and E [eV] is a predetermined energy level of the oxide semiconductor layer.

2. The thin film semiconductor device according to claim 1, wherein the density of states DOS [$eV^{-1}cm^{-3}$] satisfies the following relationship:

$$DOS \leq 1.332 \times 10^{10} \times (Ec-E)^{14.65}$$

provided that $2.0\ eV \leq Ec-E \leq 2.7\ eV$.

3. The thin film semiconductor device according to claim 1, further comprising:
   a second insulating layer disposed on the gate electrode,
   wherein the oxide semiconductor layer is disposed on the second insulating layer,
   a contact hole for exposing part of the oxide semiconductor layer is disposed in the first insulating layer, and
   the source electrode and the drain electrode are disposed on the first insulating layer and connected to the oxide semiconductor layer through the contact hole.

4. The thin film semiconductor device according to claim 1, further comprising:
   a second insulating layer disposed on the gate electrode,
   wherein the oxide semiconductor layer is disposed on the second insulating layer,
   the source electrode and the drain electrode are disposed on the oxide semiconductor layer, and
   the first insulating layer is disposed on the source electrode, the drain electrode, and the oxide semiconductor layer.

5. The thin film semiconductor device according to claim 1, wherein the gate electrode is disposed on the first insulating layer.

6. The thin film semiconductor device according to claim 1, wherein the oxide semiconductor layer comprises a transparent amorphous oxide semiconductor.

7. A method for manufacturing a thin film semiconductor device, the method comprising steps of:
   (a) forming a gate electrode above a substrate;

(b) forming an oxide semiconductor layer at a position above the substrate and opposing the gate electrode;

(c) performing a plasma treatment on the oxide semiconductor layer by using gas containing oxygen;

(d) forming a first insulating layer on the oxide semiconductor layer; and (e) forming a source electrode and a drain electrode each connected to the oxide semiconductor layer, wherein, in the performing step (c) the plasma treatment is performed in particular conditions that a density of states DOS [$eV^{-1}cm^{-3}$] of oxygen defects in the oxide semiconductor layer satisfies the following relationship:

$$DOS \leq 1.710 \times 10^{17} \times (Ec-E)^2 - 6.468 \times 10^{17} \times (Ec-E) + 6.113 \times 10^{17}$$

provided that $2.0\ eV \leq Ec-E \leq 2.7\ eV$, where Ec [eV] is an energy level of a conduction band edge of the oxide semiconductor layer and E [eV] is a predetermined energy level of the oxide semiconductor layer.

8. The method for manufacturing a thin film semiconductor device according to claim 7, wherein the gas contains nitrous oxide, and a power density of the plasma treatment is 1 [$W/cm^2$] or less.

9. The method for manufacturing a thin film semiconductor device according to claim 8, wherein the power density of the plasma treatment is 0.2 [$W/cm^2$] or more.

10. The method for manufacturing a thin film semiconductor device according to claim 7, wherein the gas contains nitrous oxide, and in the performing step (c) the plasma treatment is performed at a pressure of 2.0 [Torr] or more.

11. The method for manufacturing a thin film semiconductor device according to claim 7, further comprising a step of:

(f) forming a second insulating layer on the gate electrode, wherein, in the forming step (b) the oxide semiconductor layer is formed on the second insulating layer, in the forming step (d) the first insulating layer is formed so that part of the oxide semiconductor layer is exposed, and in the forming step (e) the source electrode and the drain electrode are formed so as to connect to the oxide semiconductor layer at the exposed part.

12. The method for manufacturing a thin film semiconductor device according to claim 7, further comprising a step of:

(f) forming a second insulating layer on the gate electrode, wherein in the forming step (b) the oxide semiconductor layer is formed on the second insulating layer, in the forming step (e) the source electrode and the drain electrode are formed on the oxide semiconductor layer, and in the forming step (d) the first insulating layer is formed on the source electrode, the drain electrode, and the oxide semiconductor layer.

13. The method for manufacturing a thin film semiconductor device according to claim 12, wherein the performing step (c) is performed before the forming step (e).

14. The method for manufacturing a thin film semiconductor device according to claim 7, wherein in the forming step (a) the gate electrode is formed on the first insulating layer.

15. The method for manufacturing a thin film semiconductor device according to claim 7, wherein the performing step (c) is performed before the forming step (d).

16. The method for manufacturing a thin film semiconductor device according to claim 7, wherein the oxide semiconductor layer comprises a transparent amorphous oxide semiconductor.

\* \* \* \* \*